(12) United States Patent
Tokita

(10) Patent No.: US 6,836,316 B2
(45) Date of Patent: Dec. 28, 2004

(54) SUBSTRATE HOLDING APPARATUS AND EXPOSURE APPARATUS USING THE SAME

(75) Inventor: Toshinobu Tokita, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 22 days.

(21) Appl. No.: 10/201,989

(22) Filed: Jul. 25, 2002

(65) Prior Publication Data

US 2003/0020891 A1 Jan. 30, 2003

(30) Foreign Application Priority Data

Jul. 26, 2001 (JP) .................................... 2001-225574
Jul. 30, 2001 (JP) .................................... 2001-229889

(51) Int. Cl.⁷ .................. G03B 27/58; G03B 27/42; G03B 27/52; G03B 11/00
(52) U.S. Cl. ................. 355/72; 355/30; 355/53; 355/73
(58) Field of Search ................. 355/30, 53, 72, 355/73, 74; 378/34; 250/492.2; 269/21

(56) References Cited

U.S. PATENT DOCUMENTS

| | | | | |
|---|---|---|---|---|
| 5,374,829 A | * | 12/1994 | Sakamoto et al. | ...... 250/453.11 |
| 5,563,683 A | * | 10/1996 | Kamiya | ........................ 355/53 |
| 5,738,165 A | * | 4/1998 | Imai | ........................... 165/80.2 |
| 5,793,474 A | * | 8/1998 | Nishi | ............................. 355/72 |
| 5,923,408 A | * | 7/1999 | Takabayashi | ................. 355/53 |
| 5,959,304 A | | 9/1999 | Tokita et al. | ............ 250/492.2 |
| 6,023,405 A | | 2/2000 | Shamouilian et al. | ....... 361/234 |
| 6,084,938 A | * | 7/2000 | Hara et al. | ...................... 378/34 |
| 6,413,701 B1 | * | 7/2002 | van Empel et al. | .......... 430/320 |
| 2002/0008864 A1 | * | 1/2002 | Kondo | ......................... 355/72 |
| 2003/0001103 A1 | * | 1/2003 | Kobayashi et al. | .... 250/440.11 |

FOREIGN PATENT DOCUMENTS

| | | |
|---|---|---|
| EP | 1 059 566 A2 | * 12/2000 |
| JP | 10-223520 | 8/1998 |
| WO | WO 01/11431 A2 | 2/2001 |

OTHER PUBLICATIONS

European Search Report dated Dec. 22, 2003, issued in corresponding European patent appln. No. 02 25 5196, forwarded in a Communication dated Jan. 7, 2004.

* cited by examiner

Primary Examiner—Alan Mathews
(74) Attorney, Agent, or Firm—Fitzpatrick, Cella, Harper & Scinto

(57) ABSTRACT

An exposure apparatus for exposing a pattern of a mask onto a substrate. The apparatus includes an apparatus which includes a nonconductive holding section to hold the substrate and holds the substrate, and an electrostatic capacitance sensor which measures height-direction information of the substrate held by the apparatus which holds the substrate. The holding section includes a conductive member which is electronically grounded.

21 Claims, 18 Drawing Sheets

FIG. 16

```
URL  http://www.maintain.co.jp/db/input.html

TROUBLE DB INPUT WINDOW

DATE OF OCCURRENCE OF TROUBLE  [2000/3/15]~404      403
MODEL                          [* * * * * * * * *]~401
TROUBLE CASE NAME  [OPERATION ERROR (ERROR AT TIME OF ACTIVATION)]
DEVICE S/N         [465NS4580001]~402
EMERGENCY LEVEL    [D]~405
PROBLEM   [LED CONTINUOUS
           TO BLINK AFTER POWER-ON]~406

REMEDY    [RE-POWER ON (PRESS F D BUTTON
           AT TIME OF ACTIVATION)]~407

PROGRESS  [TEMPORARY MEASURE
           HAS BEEN TAKEN]~408

(SEND)(RESET)        410              411              412
LINK TO RESULT LIST DATABASE  SOFTWARE LIBRARY  OPERATION GUIDANCE
```

SEMICONDUCTOR DEVICE MANUFACTURING FLOW though the measurement accuracy by an electrostatic capacitance sensor improves, or provides an exposure apparatus in which the exposure transfer accuracy improves.

SUBSTRATE HOLDING APPARATUS AND EXPOSURE APPARATUS USING THE SAME

FIELD OF THE INVENTION

The present invention relates to a substrate holding apparatus for holding a substrate such as a wafer in semiconductor manufacturing, an exposure apparatus for exposing a pattern of a master such as a mask onto a substrate held by the substrate holding apparatus, a device manufacturing method using the exposure apparatus, and a maintenance method for a semiconductor manufacturing factory and an exposure apparatus.

BACKGROUND OF THE INVENTION

A conventional wafer chuck and exposure apparatus are disclosed in, e.g., Japanese Patent Laid-Open No. 10-223520. FIG. 13 shows the schematic arrangement of the wafer chuck disclosed in this prior art. Referring to FIG. 13, reference numeral 101 denotes a wafer chuck main body; and 107, a wafer. The wafer chuck main body 101 is mounted on a wafer stage (not shown) in an exposure apparatus.

The wafer chuck main body 101 has a wafer holding surface 101a which chucks the wafer 107. In addition, an internal pipe 101d serving as a temperature adjusting fluid path is formed to cause a temperature adjusting fluid to flow for adjusting the temperature of the wafer 107. Water is generally used as a temperature adjusting fluid that flows through the internal pipe 101d. The temperature of this water is controlled by a temperature adjusting unit (not shown).

Chuck grooves 101b are formed on the wafer holding surface 101a of the wafer chuck main body 101. When the chuck grooves 101b are evacuated by a vacuum pump connected to a through hole 101c, a vacuum chucking force that causes the wafer 107 to stick to the wafer holding surface 101a of the wafer chuck 101 is generated.

Recently, micropatterning of circuit patterns is making progress in order to improve the integration degree and operation speed of a solid element such as an LSI. To do this, the gap setting accuracy between the mask and the wafer in a one-to-one X-ray exposure (Proximity X-ray lithography) scheme or the auto-focus (AF) accuracy to the wafer in a reduction projecting exposure scheme must be increased.

An electrostatic capacitance sensor can be used for measuring the height of a wafer held by a wafer chuck. However, the performance of the sensor cannot be sufficiently obtained, because the wafer chuck is made of ceramic, which is a dielectric material. If the performance of the electrostatic capacitance sensor cannot be sufficiently obtained, the AF accuracy or gap setting accuracy degrades. As a consequence, the exposure transfer accuracy, e.g., the imaging performance or overlay accuracy degrades. In the one-to-one X-ray exposure scheme, if the gap setting accuracy degrades, a mask and wafer opposing each other may come into contact with each other, or the mask may be damaged during step-and-repeat operation.

SUMMARY OF THE INVENTION

The present invention has been proposed to solve the conventional problems, and has its object to provide a substrate holding apparatus which improves the AF accuracy or gap setting accuracy by improving the measurement accuracy of an electrostatic capacitance sensor, or to provide an exposure apparatus in which the exposure transfer accuracy are improved by improving the AF accuracy or the gap setting accuracy.

In order to achieve the above object, a substrate holding apparatus of the present invention comprises a nonconductive holding section which holds a substrate, wherein the holding section has a conductive member which is electrically grounded.

Preferably, the holding section which holds the substrate has the conductive member on a surface on an opposite side of a surface which holds the substrate.

More preferably, the holding section has a plurality of pins to hold the substrate.

More preferably, the conductive member has a thickness smaller than a height of the pins, and the pins hold the substrate while separating the substrate from the conductive member.

More preferably, the holding section has a plurality of members divided in a predetermined direction, at least one of the plurality of members having the conductive member.

More preferably, the predetermined direction is a direction of thickness of the holding section.

More preferably, at least one of the plurality of members has a channel for a fluid which adjusts a temperature of the holding section.

More preferably, the holding section has the conductive member on a side surface portion.

More preferably, the conductive member is formed by depositing chromium.

More preferably, the conductive member is formed by plating.

More preferably, the conductive member is one of a metal plate and a metal foil.

In the substrate holding apparatus of the present invention, the measurement accuracy by the electrostatic capacitance sensor can be increased.

Further, an exposure apparatus of the present invention comprises the following arrangement.

That is, an exposure apparatus for exposing a pattern of a mask onto a substrate, comprises an apparatus which includes a nonconductive holding section to hold the substrate and holds the substrate; and an electrostatic capacitance sensor which measures height-direction information of the substrate held by the apparatus which holds the substrate, wherein the holding section includes a conductive member which is electrically grounded.

Preferably, the apparatus further comprises a calibration section which executes calibration of the electrostatic capacitance sensor.

More preferably, the calibration section comprises a light source section which makes light incident on an entry window formed in the mask, and a sensor which detects light that becomes incident from the entry window, is reflected by the substrate, and exits an exit window formed in the mask.

More preferably, the apparatus further comprises an interface connected to a network, a computer which executes network software to data-communicate maintenance information of the exposure apparatus through the network, and a display which displays the maintenance information of the exposure apparatus communicated by the network software executed by the computer.

More preferably, the network software provides, on the display, a user interface connected to an external network outside a factory in which the exposure apparatus is installed to access a maintenance database provided by a vendor or user of the exposure apparatus and allows obtaining information from the database through the external network.

In the exposure apparatus of the present invention, the improved exposure transfer accuracy can be provided by increasing the AF accuracy or the gap setting accuracy.

Further, a device manufacturing method comprises the steps of installing, in a factory, a plurality of semiconductor manufacturing apparatuses for performing various processes, including an exposure apparatus; and manufacturing a semiconductor device using the plurality of semiconductor manufacturing apparatuses, wherein the exposure apparatus comprises a substrate holding apparatus which includes a nonconductive holding section to hold a substrate, and an electrostatic capacitance sensor which measures height-direction information of the substrate held by the substrate holding apparatus, and the holding section includes a conductive member which is electrically grounded.

More preferably, the method further comprises the steps of connecting the plurality of semiconductor manufacturing apparatuses through a local area network, connecting the local area network to an external network outside the factory, acquiring information related to the exposure apparatus from a database on the external network using the local area network and external network, and controlling the exposure apparatus on the basis of the acquired information.

More preferably, the maintenance information of the exposure apparatus is obtained by data communication by accessing, through the external network, a database provided by a vendor or user of the exposure apparatus, or production management is done by data communication with a semiconductor manufacturing factory different from the semiconductor manufacturing factory through the external network.

Further, a semiconductor manufacturing factory comprises a plurality of semiconductor manufacturing apparatuses including an exposure apparatus; a local area network which connects the plurality of semiconductor manufacturing apparatuses; and a gateway which connects the local area network to an external network outside the semiconductor manufacturing factory, wherein information related to at least one of the plurality of semiconductor manufacturing apparatuses can be data-communicated, the exposure apparatus comprises a substrate holding apparatus which includes a nonconductive holding section to hold a substrate, and an electrostatic capacitance sensor which measures height-direction information of the substrate held by the substrate holding apparatus, and the holding section includes a conductive member which is electrically grounded.

Further, a maintenance method for an exposure apparatus, comprises the steps of: causing a vendor or user of the exposure apparatus to provide a maintenance database connected to an external network outside a semiconductor manufacturing factory; connecting the exposure apparatus to a local area network in the factory; and maintaining the exposure apparatus on the basis of information accumulated in the database using the external network and local area network, wherein the exposure apparatus comprises a substrate holding apparatus which includes a nonconductive holding section to hold a substrate, and an electrostatic capacitance sensor which measures height-direction information of the substrate held by the substrate holding apparatus, and the holding section includes a conductive member which is electrically grounded.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 16 is a view showing a detailed example of a user interface;

DETAILED DESCRIPTION OF THE PREFERRED EMBODIMENTS

Preferred embodiments of the present invention will now be described in detail in accordance with the accompanying drawings.

[First Embodiment]

Figure 1:
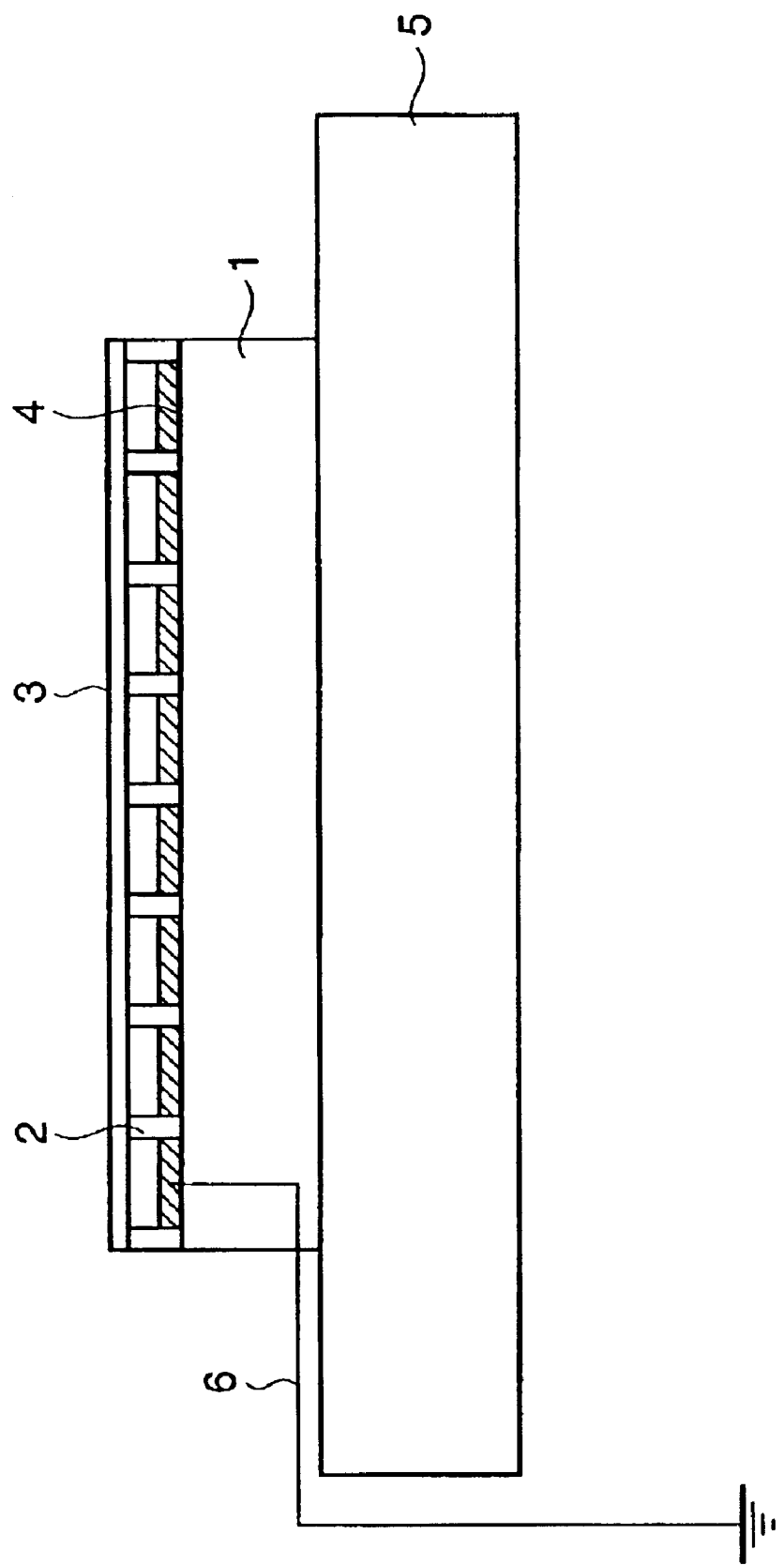
FIG. 1 is a view for explaining a wafer chuck according to the first embodiment.

FIG. 1 shows a wafer chuck according to an embodiment of the present invention. Referring to FIG. 1, reference numeral 1 denotes a wafer chuck for chucking a wafer; 2, pins; and 3, a wafer. The pins 2 are arranged to reduce the contact area between the wafer 3 and the wafer chuck 1 while the wafer is being chucked and also to prevent or reduce degradation in flatness of the wafer 3 even when a foreign substance is mixed. The wafer chuck 1 and pins 2 are integrated. Reference numeral 4 denotes a chromium deposited portion; 5, a chuck base for holding the wafer chuck; and 6, a lead line for grounding the chromium deposited portion 4. In the wafer chuck 1, the chromium deposited portion 4 is formed to a thickness smaller than the height of the pins 2. When the wafer 3 is being chucked, the pins 2 hold the wafer 3 while separating it from the chromium deposited portion 4. With this arrangement, since the wafer 3 and chromium deposited portion 4 do not come into contact, any particles or contamination due to chromium can be prevented.

Although the wafer chuck 1 also has a vacuum hole for chucking the wafer 3 and an internal pipe for causing a temperature adjusting fluid to flow for controlling the temperature of the wafer 3, these components are not illustrated in FIG. 1.

Figure 2:
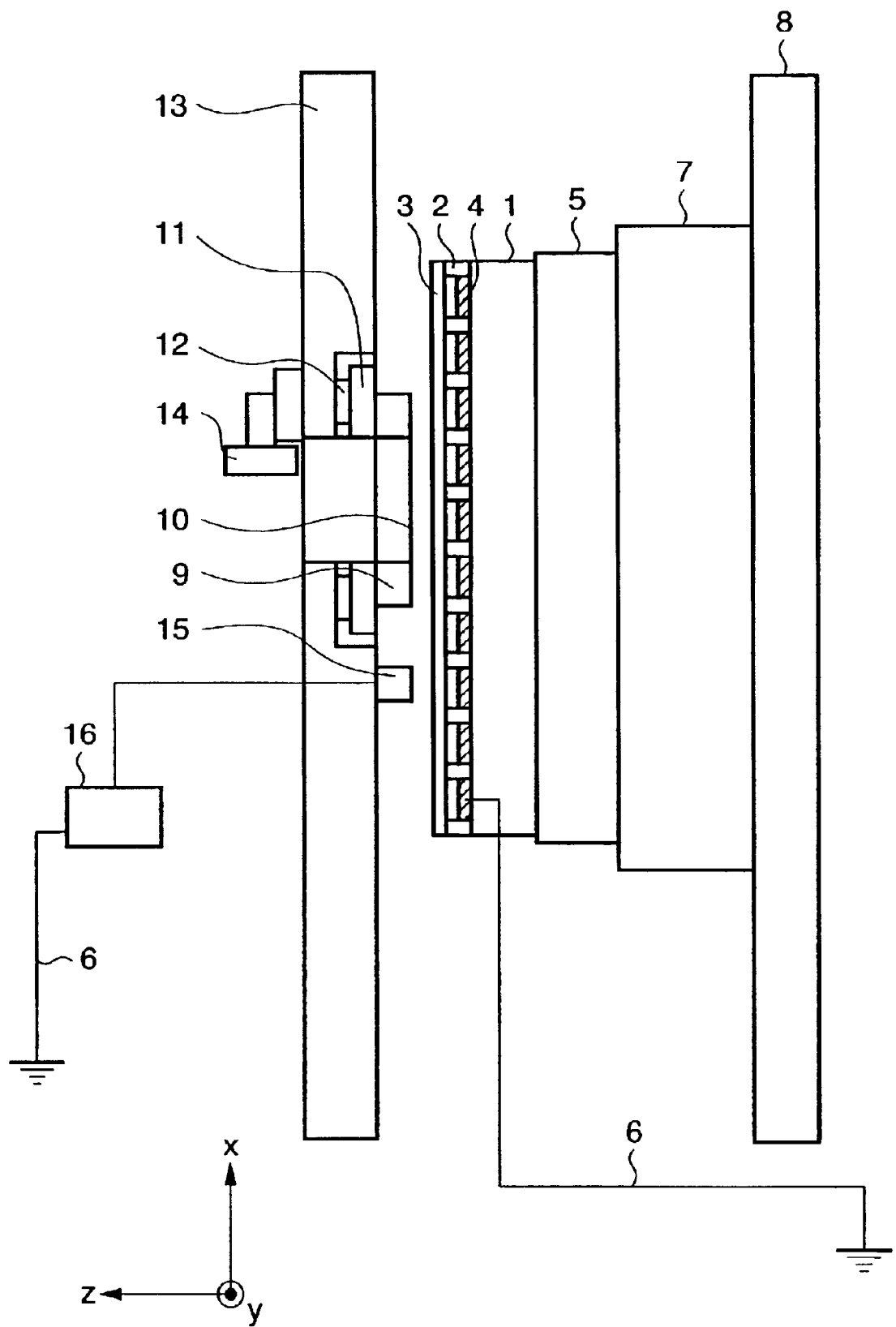
FIG. 2 is a view for explaining the arrangement of an exposure apparatus according to the first embodiment.

FIG. 2 shows an exposure apparatus according to an embodiment of the present invention so as to explain an arrangement for measuring the height of a wafer by an electrostatic capacitance sensor. FIG. 2 schematically shows an exposure apparatus of a one-to-one X-ray exposure scheme. The same reference numerals as in FIG. 1 denote the same parts in FIG. 2. Reference numeral 7 denotes a wafer stage used to drive between shots; 8, a stage platen which supports the wafer stage 7; 9, a mask; 10, a mask membrane on which a circuit pattern is formed; 11, a mask chuck for holding the mask; 12, a mask stage; 13, a mask stage base; and 14, an alignment scope. The mask 9 and mask chuck 11 are mounted on the mask stage 12. The mask stage 12 is mounted on the mask stage base 13. Reference numeral 15 denotes a wafer height sensor probe which measures the height of the wafer 3 using an electrostatic capacitance sensor so as to measure the gap; and 16, an amplifier of the wafer height sensor probe 15.

Gap setting will be described with reference to FIG. 2. First, for height setting (Z direction) of the mask 9, the height of the mask 9 is measured by a mask height sensor (not shown), and the mask 9 is positioned to the apparatus reference. Next, for height setting of the wafer 3, the height information of the wafer is measured using the wafer height sensor probe 15 before the mask 9 opposes the wafer 3, and positioning is performed such that the mask 9 and wafer 3 have a predetermined gap therebetween. The wafer stage 7 moves the wafer 3 below the wafer height sensor probe 15. The wafer height sensor probe 15 measures the height information of the wafer 3. On the basis of the height measurement result, the gap between the mask 9 and the wafer 3 is set.

In gap setting of this embodiment, the height position of the mask 9 is set using the apparatus as a standard, and the gap between the mask and the wafer is set on the basis of the measured height value of the wafer 3. However, the present invention is not limited to this. For example, instead of setting the height position of the mask 9 using the apparatus as a standard, the gap may be set on the basis of the position information of the mask 9 in the direction of height and the measurement result of the wafer 3 in the direction of height in gap setting. The height position of the mask 9 may be set using the alignment scope 14.

Figure 3:
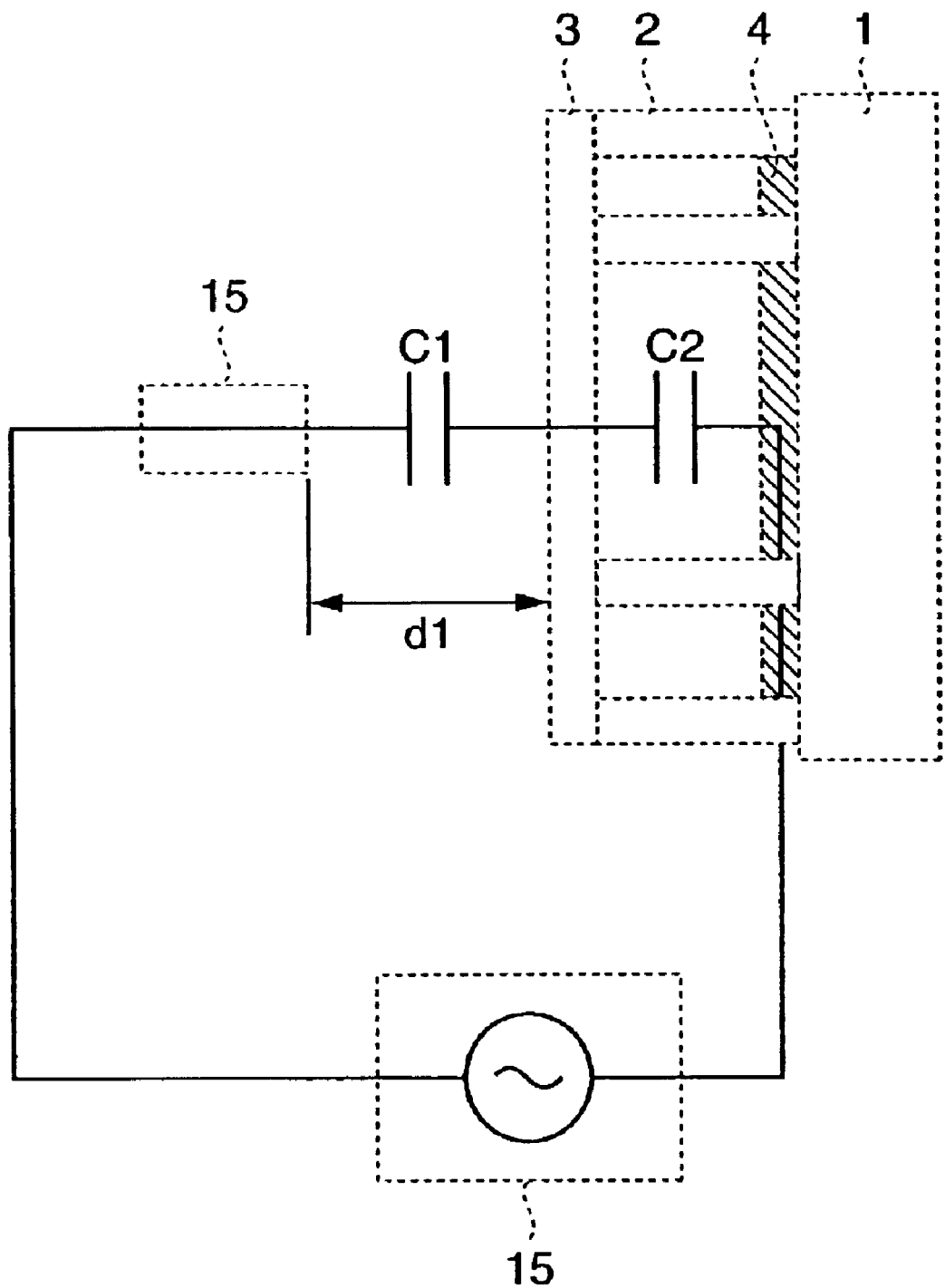
FIG. 3 is a view for explaining wafer height measurement according to the first embodiment.

In this embodiment, the chromium deposited portion 4 is grounded through the lead line 6. The amplifier 16 is also grounded through the lead line 6. That is, the chromium deposited portion 4 and amplifier 16 are commonly grounded. To accurately measure the height of the wafer 3 by the electrostatic capacitance sensor, the potential difference between the ground lines is preferably zero. The two lead lines 6 may be connected. For example, the lead line 6 from the chromium deposited portion 4 may be connected to the GND (ground) terminal of the amplifier 16. FIG. 3 schematically shows a circuit for measuring the height of the wafer 3 in this arrangement.

An electrostatic capacitance sensor measures the displacement or height of a target using the electrostatic capacitance from a sensor probe to the target. When the electrostatic capacitance sensor is applied to measure the height of the wafer 3, a portion near the wafer 3 must be grounded because it is difficult to directly ground the wafer 3 because of the arrangement of the exposure apparatus. The wafer chuck 1 has the chromium deposited portion 4 which opposes the surface (holding surface) on which the wafer 3 is chucked. When the chromium deposited portion 4 is grounded, a capacitance C1 between the wafer height sensor probe 15 and the surface of the wafer 3 and a capacitance C2 between the holding surface of the wafer 3 and the chromium deposited portion 4, i.e., the wafer chuck 1 are formed as a series circuit. When this circuit is measured by the electrostatic capacitance sensor, the height (d1) of the wafer 3 can be measured from a total capacitance C.

The total capacitance C is calculated by $$1/C = (1/C1) + (1/C2) \quad (1)$$

When the capacitance C2 is much larger than the capacitance C1, the term (1/C2) is much smaller than the term (1/C1) and can be neglected. Hence, C≈C1. At this time, the height information of the wafer 3 as a target can be accurately measured without degrading the performance of the electrostatic capacitance sensor.

In equation (1), to satisfy C≈C1, C2>>C1 must hold. Let d be the distance for the surface of the chromium deposited portion 4 to the distal end of the pin 2, ϵ be the permittivity therebetween, and S be the area of the chromium deposited portion 4. The capacitance of the wafer chuck 1 is given by $$C2 = \epsilon S/d \quad (2)$$

To increase the capacitance C2, the chromium deposited portion 4 preferably has almost the same surface area as that of the wafer 3. Hence, in the wafer chuck 1, the chromium deposited portion 4 is preferably deposited on the entire surface for chucking the wafer 3 except the portions of the pins 2. However, the chromium deposited portion 4 only needs to be deposited in a predetermined area or more.

More strictly, in FIG. 3, a resistor and capacitor (neither are shown) are formed in parallel on the wafer 3. These elements can also be neglected, like the above-described capacitance C2. Hence, the total capacitance C in FIG. 3 is given by C≈C1. With the above arrangement, the height information of the wafer 3 as a target can be accurately measured without degrading the performance of the electrostatic capacitance sensor.

In this embodiment, chromium is used for a conductive member. However, the present invention is not limited to this. Other than chromium, a material having a volume resistivity of $10 \times 10^{-6}$ Ω cm or less, such as gold, is preferably used. Even a material having a volume resistivity of about 1.0 Ω cm can exhibit the same effect as described above. The conductive member is formed by deposition. However, the present invention is not limited to this. Plating may be used.

In the step of depositing chromium, chromium is deposited after portions corresponding to the pins 2 on the surface of the wafer chuck 1, where the wafer 3 is to be chucked, are masked. Alternatively, after chromium is deposited on the surface of the wafer chuck 1, where the wafer 3 is to be chucked, chromium deposited portions corresponding to the pins 2 may be removed.

As a grounding method, in this embodiment, the chromium deposited portion 4 is grounded through the lead line 6. However, the present invention is not limited to this. For example, the chromium deposited portion 4 may be extended to the side surface portion of the wafer chuck 1 and grounded from the side surface of the wafer chuck 1, which is in contact with the chromium deposited portion 4, through the lead line 6.

The substrate holding apparatus of this embodiment can be applied to an exposure apparatus of a one-to-one X-ray exposure scheme. However, the exposure apparatus to which the substrate holding apparatus can be applied is not limited to this. Even an exposure apparatus of a reduction projecting exposure scheme may be used as long as its arrangement has electrical grounding from a conductive portion arranged on a wafer chuck.

As described above, according to the substrate holding apparatus of this embodiment, even when a substrate is held using low pins, the capacitance relationship (C2>>C1) necessary for measurement can be formed. Hence, the measurement accuracy of the electrostatic capacitance sensor can be increased.

When low pins are used, particles or contamination can be prevented. In addition, since an effective restriction effect is generated by the substrate holding section, a chuck pressure or vacuum pressure necessary for chucking/holding a wafer can be obtained. Hence, the chucking/holding performance can be improved.

When a conductive portion is formed, grounding is facilitated.

Furthermore, since the gap setting accuracy can be increased, an exposure apparatus with a higher exposure transfer accuracy can be provided. Moreover, along with the improvement of chucking/holding performance, the wafer stage can be moved at a high speed, resulting in higher throughput of the exposure apparatus.

[Second Embodiment]

Figure 4:
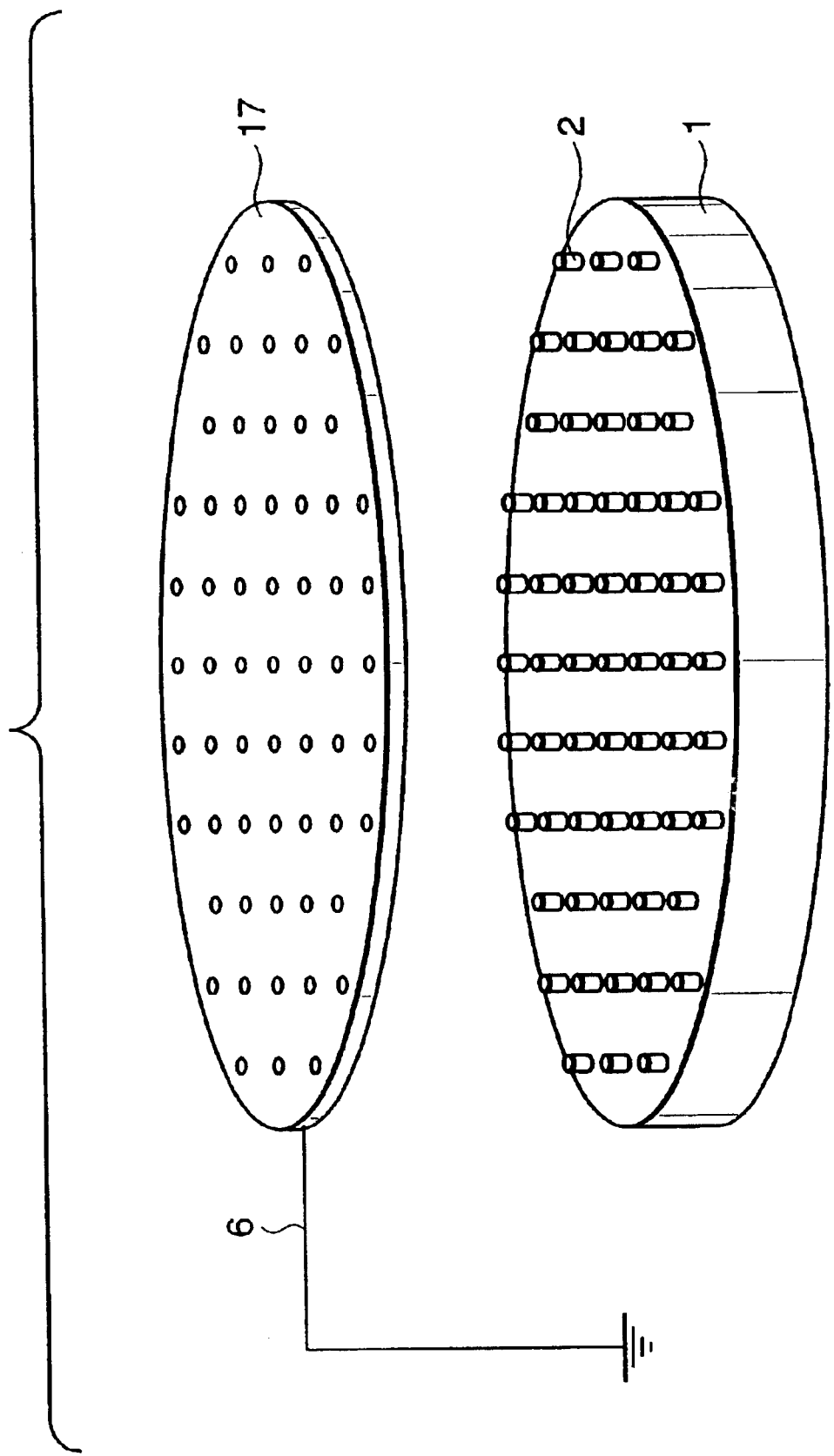
FIG. 4 is a view for explaining a wafer chuck according to the second embodiment.

In the first embodiment, chromium is deposited on the surface of the wafer chuck 1, where the wafer 3 is to be chucked. In the second embodiment, an aluminum plate is used in place of a chromium deposited portion. FIG. 4 is a view for explaining a wafer chuck according to this embodiment. Referring to FIG. 4, reference numeral 1 denotes a wafer chuck for chucking a wafer; and 2, pins. The wafer chuck 1 and pins 2 are integrated. Reference numeral 6 denotes a lead line for grounding; and 17, an aluminum plate. The aluminum plate 17 has holes in a number equal to or more than the pins 2. Each hole must have such a size and position that a corresponding pin 2 can pass through that hole when the aluminum plate 17 is placed on the wafer chuck 1. In addition, the surface of the aluminum plate 17 must be at a level lower than that of the distal ends of the pins 2 when the aluminum plate 17 is placed on the wafer chuck 1. With this arrangement, since a wafer 3 does not come into contact with the aluminum plate 17, particles or contamination due to aluminum can be prevented. Although the wafer chuck 1 and aluminum plate 17 can be jointed by an arbitrary method, bonding is preferably used.

Although the wafer chuck 1 also has a vacuum hole for chucking the wafer 3 and an internal pipe for causing a temperature adjusting fluid to flow for controlling the temperature of the wafer, these components are not illustrated in FIG. 4.

The wafer chuck 1 has the aluminum plate 17 on the surface for chucking the wafer 3. However, the present invention is not limited to this. Other than aluminum, a material having a volume resistivity of $10 \times 10^{-6}$ Ω cm or less, such as chromium or gold, is preferably used. Even a material having a volume resistivity of about 1.0 Ω cm can exhibit the same effect as described above. The thickness of the aluminum plate 17 must be smaller than the height of the pins 2. Hence, even a metal foil can exhibit a sufficient effect.

As described above, according to this embodiment, since the wafer chuck can be manufactured in accordance with the same procedure as in the prior art except that only the aluminum plate is separately manufactured and attached, the production efficiency is high.

[Third Embodiment]

Figure 5:
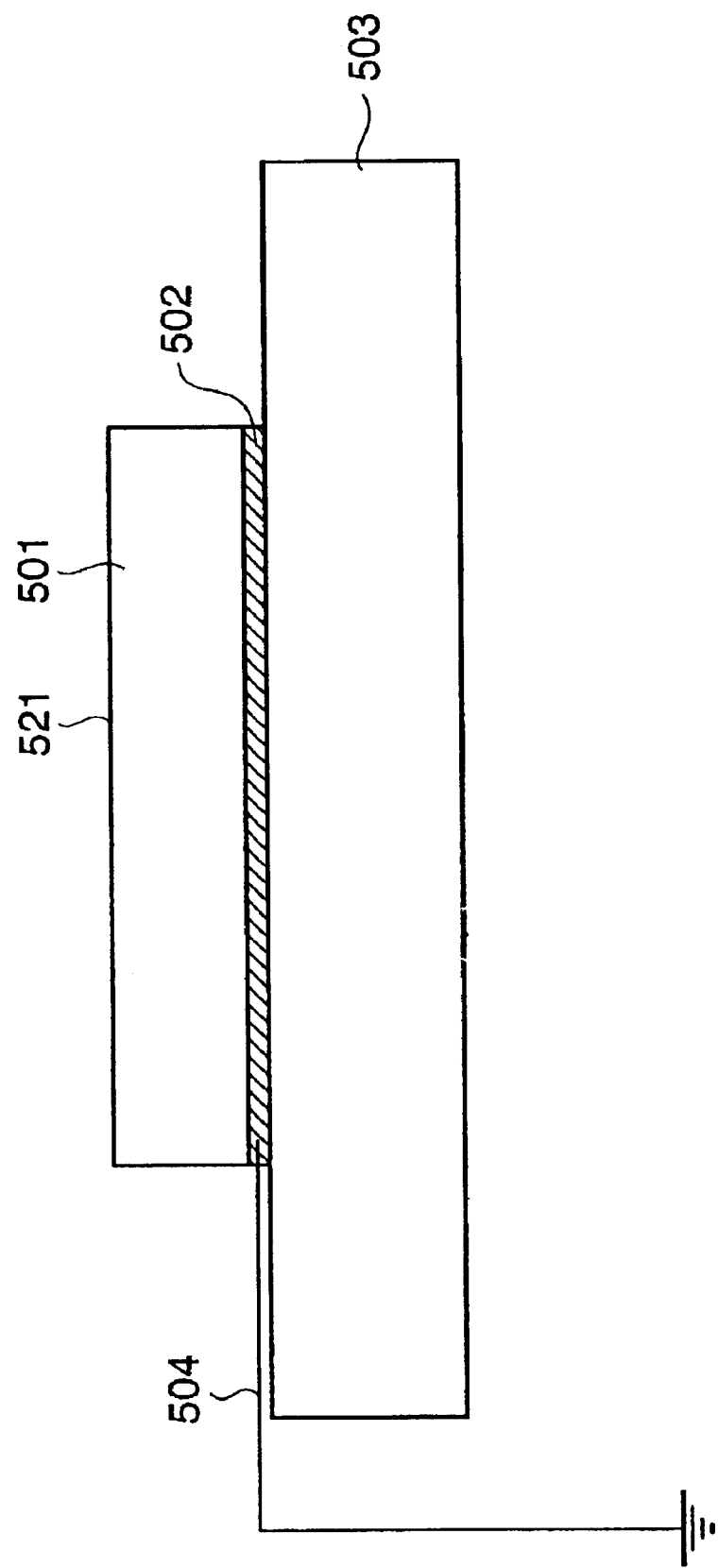
FIG. 5 is a view for explaining a wafer chuck according to the third embodiment.

FIG. 5 shows a wafer chuck according to an embodiment of the present invention. Referring to FIG. 5, reference numeral 501 denotes a wafer chuck for chucking a wafer as a substrate; 502, a chromium deposited portion; and 503, a chuck base for holding the wafer chuck. In the wafer chuck 501, the chromium deposited portion 502 is deposited on a surface opposite to a holding surface 521 which chucks the wafer. Reference numeral 504 denotes a lead line for grounding the chromium deposited portion 502. Although the wafer chuck 501 also has a vacuum hole for chucking the wafer and an internal pipe for causing a temperature adjusting fluid to flow for controlling the temperature of the wafer, these components are not illustrated in FIG. 5.

Figure 6:
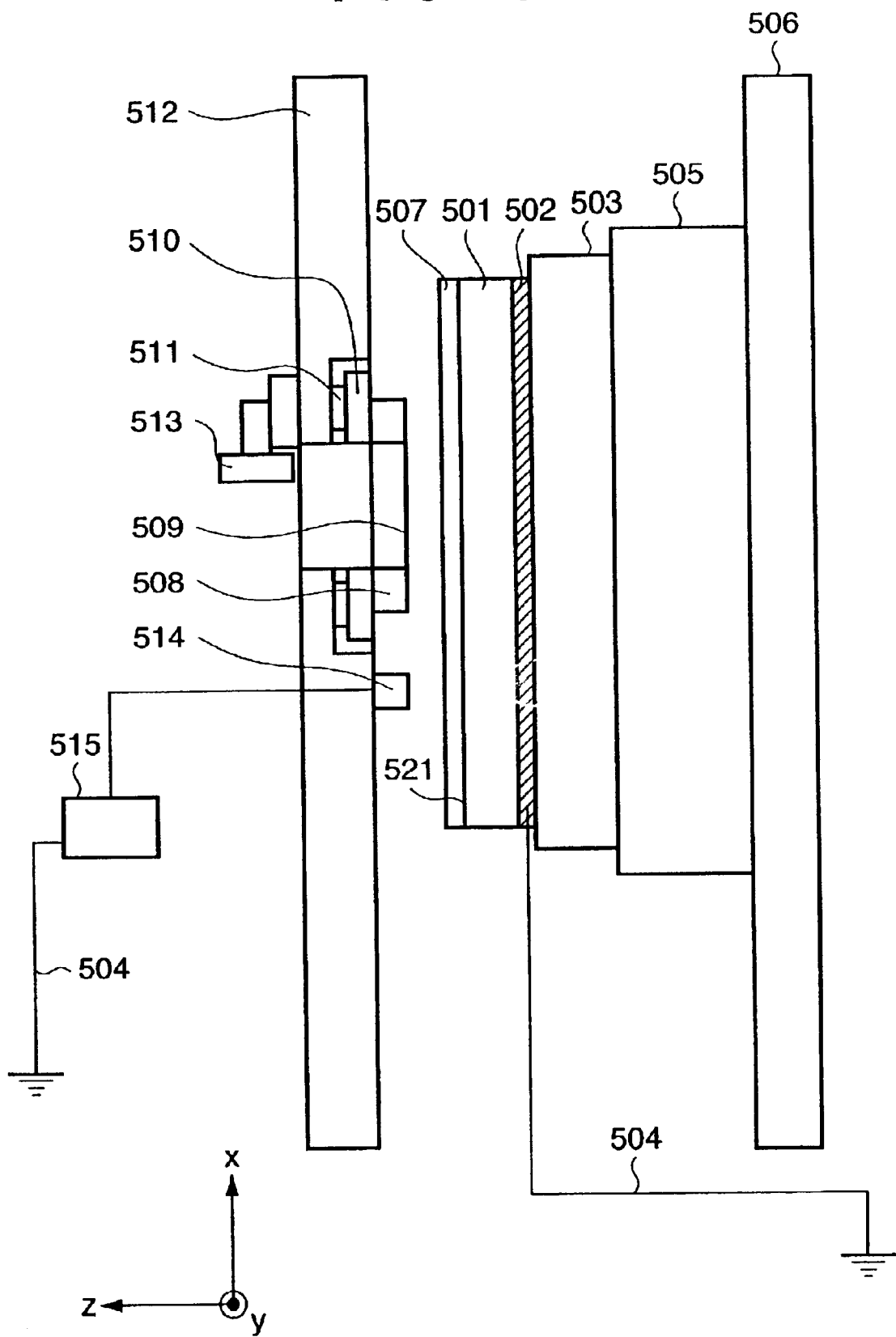
FIG. 6 is a view explaining the arrangement of an exposure apparatus according to the third embodiment of the present invention.

FIG. 6 shows an exposure apparatus according to an embodiment of the present invention so as to explain an arrangement for measuring the height of a wafer by an electrostatic capacitance sensor which is included in a measurement system. FIG. 6 schematically shows an exposure apparatus of a one-to-one X-ray exposure scheme. Referring to FIG. 6, reference numeral 502 denotes the wafer chuck for chucking a substrate (wafer) 507; 502, the chromium deposited portion; 503, the chuck base for holding the wafer chuck 501; and 504, the lead line for grounding. Reference numeral 505 denotes a wafer stage used to drive between shots; 6, a stage platen which supports the wafer stage 505; 508, a mask; 509, a mask membrane on which a circuit pattern is formed; 510, a mask chuck for holding the mask; 511, a mask stage; 512, a mask stage base; and 513, an alignment scope. The mask 508 and mask chuck 510 are mounted on the mask stage 511. The mask stage 511 is mounted on the mask stage base 512. Reference numeral 514 denotes a wafer height sensor probe which measures the height of the wafer using an electrostatic capacitance sensor so as to measure the gap; and 515, an amplifier of the wafer height sensor probe 514.

Gap setting will be described with reference to FIG. 6. First, for height setting (Z direction) of the mask 508, the height of the mask 508 is measured by a mask height sensor (not shown). The measured height information is set as data using, as a standard, the apparatus in which the sensor is installed. Next, the height information of the wafer 507 is measured using the wafer height sensor probe 514 before the mask 508 and wafer 507 are positioned to predetermined positions and oppose each other. The wafer stage 505 moves the wafer 507 below the wafer height sensor probe 514. The wafer height sensor probe 514 measures the height information of the wafer 507. On the basis of the height measurement result, the gap between the mask 508 and the wafer 507 is set.

In gap setting of this embodiment, the height position of the mask 508 is set using the apparatus as a standard, and the gap between the mask and the wafer is set on the basis of the measured height value of the wafer 507. However, the present invention is not limited to this. For example, instead of setting the height position of the mask 508 using the apparatus as a standard, the gap may be set on the basis of the height position information of the mask 508 and the measurement result of the wafer 507 in the direction of height in gap setting. The height position of the mask 508 may be set using the alignment scope 513.

Figure 7:
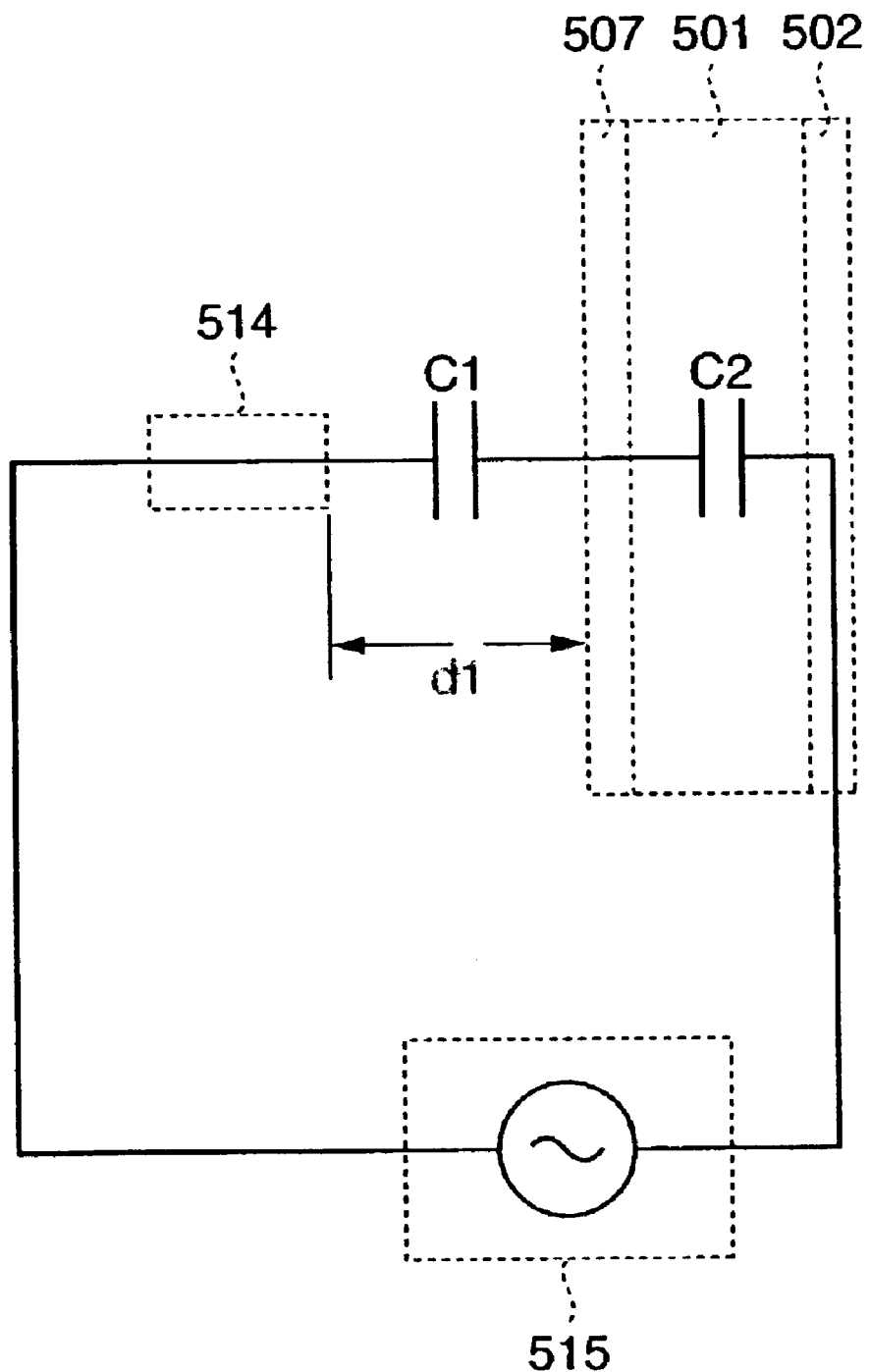
FIG. 7 is a view explaining wafer height measurement according to the third embodiment of the present invention.

In this embodiment, the chromium deposited portion 502 is grounded through the lead line 504. The amplifier 515 is also grounded through the lead line 504. That is, the chromium deposited portion 502 and amplifier 515 are commonly grounded. To accurately measure the height of the wafer 507 by the electrostatic capacitance sensor, the potential difference between the ground lines is preferably zero. The two lead lines 504 may be connected. For example, the lead line 504 from the chromium deposited portion 502 may be connected to the GND terminal of the amplifier 515. FIG. 7 schematically shows a circuit for measuring the height of the wafer 507 in this arrangement.

An electrostatic capacitance sensor measures the displacement or height of a target using the electrostatic capacitance from the sensor probe 514 to the target. When the electrostatic capacitance sensor is applied to measure the height of the wafer 507, a portion near the wafer 507 must be grounded because it is difficult to directly ground the wafer 507 because of the arrangement of the exposure apparatus. In a general exposure apparatus, many of wafer chucks and stages consist of dielectrics, such as ceramics. However, in this embodiment, the wafer chuck 501 has the chromium deposited portion 502 on a surface opposite to a holding surface 521 on which the wafer 507 is chucked. When the chromium deposited portion 502 is grounded, a capacitance C1 between the wafer height sensor probe 514 and the wafer 507 and a capacitance C2 between the wafer 507 and the chromium deposited portion 502, i.e., the wafer chuck 501 are formed as a series circuit, as shown in FIG. 7. When this circuit is measured by the electrostatic capacitance sensor, the height (d1) of the wafer 507 can be measured from a total capacitance C. The total capacitance C is calculated in the same manner as the equation (1) of the first embodiment. When the capacitance C2 is much larger than the capacitance C1, the term (1/C2) is much smaller than the term (1/C1) and can be neglected. Hence, C≈C1. At this time, the height of the wafer 507 as a target can accurately be measured without degrading the performance of the electrostatic capacitance sensor.

In equation (1), to satisfy C≈C1, C2>>C1 must hold. Let d be the thickness of the wafer chuck 501, ϵ be the permittivity, and S be the area of the chromium deposited portion 502. The capacitance of the wafer chuck 501 is given in the same manner as the equation (2) of the first embodiment. To increase the capacitance C2, the chromium deposited portion 502 preferably has almost the same surface area as that of the wafer 507. Hence, the chromium deposited portion 502 is preferably entirely deposited on the surface, opposite to the surface on which the wafer 507 is chucked, of the wafer chuck 501. However, the chromium deposited portion 502 only needs to be deposited in a predetermined area or more.

More strictly, in FIG. 7, a resistor and capacitor (neither are shown) are formed in parallel on the wafer 507. These elements can also be neglected, like the above-described capacitance C2. Hence, the total capacitance C in FIG. 7 is given by C≈C1. With the above arrangement, the height of the wafer 507 as a target can be accurately measured without degrading the performance of the electrostatic capacitance sensor.

In this embodiment, chromium is used for a conductive member which is formed on a surface opposite to a surface on which the wafer 507 is chucked. However, the present invention is not limited to this. Other than chromium, a material having a volume resistivity of $10 \times 10^{-6}$ Ω cm or less, such as gold, is preferably used. Even a material having a volume resistivity of about 1.0 Ω cm can exhibit the same effect as described above. The conductive member is formed by deposition. However, the present invention is not limited to this. Plating may be used. In addition, a metal foil such as a tinfoil may be sandwiched between the wafer chuck 1 and chuck base 503, or a metal plate such as an aluminum plate may be sandwiched between them.

As a grounding method, in this embodiment, the chromium deposited portion 502 is grounded through the lead line 504. However, the present invention is not limited to this. For example, all or part of the chuck base 503 may be grounded as a conductive member, and the wafer chuck 501 may be mounted on the chuck base 503 so as to cause the conductive portion and chromium deposited portion 502 to come into contact with each other.

The substrate chuck of this embodiment can be applied to an exposure apparatus of a one-to-one X-ray exposure scheme. However, the exposure apparatus to which the substrate chuck can be applied is not limited to this. Even an exposure apparatus of a reduction projecting exposure scheme may be used as long as its arrangement has electrical grounding from a conductive portion arranged on a wafer chuck.

Deposition or plating of a conductive member is necessary only for one side of the wafer chuck 501 and can be performed with ease.

As described above, according to this embodiment, a conductive member is arranged on at least the opposite surface of the holding surface of the substrate chuck, which chucks and holds a substrate. Alternatively, the substrate chuck is formed from two members, and a conductive member is arranged between those members. The conductive member is electrically grounded. With this arrangement, the measurement accuracy in measuring the height of the substrate using an electrostatic capacitance sensor can be increased.

In addition, since the gap setting accuracy or AF accuracy based on the measurement result increases, an exposure apparatus with an improved exposure transfer accuracy can be provided.

[Fourth Embodiment]

In the first embodiment, the chromium deposited portion 502 of the wafer chuck 501 is grounded through the lead line 504. To the contrary, in the fourth embodiment, chromium is deposited not only on a surface of a wafer chuck 501 opposite to a holding surface 521 on which a wafer 507 is to be chucked but also on the side surface of the wafer chuck 501 partly or throughout its perimeter, and the side surface portion is grounded through a lead line 504, as shown in FIG. 8.

As described in the third embodiment, a chromium deposited portion 502 is formed by deposition. However, the present invention is not limited to this. Other than chromium, a material having a volume resistivity of $10 \times 10^{-6}$ Ω cm or less, such as gold, is preferably used. Even a material having a volume resistivity of about 1.0 Ω cm can exhibit the same effect as described above. Additionally, the conductive member may be formed by plating in place of deposition.

As a grounding method, in this embodiment, the chromium deposited portion 502 is grounded through the lead line 504. However, the present invention is not limited to this. For example, all or part of a chuck base 503 may be grounded as a conductive member, and the wafer chuck 501 may be mounted on the chuck base 503 so as to cause the conductive portion and chromium deposited portion 502 to come into contact with each other.

Figure 8:
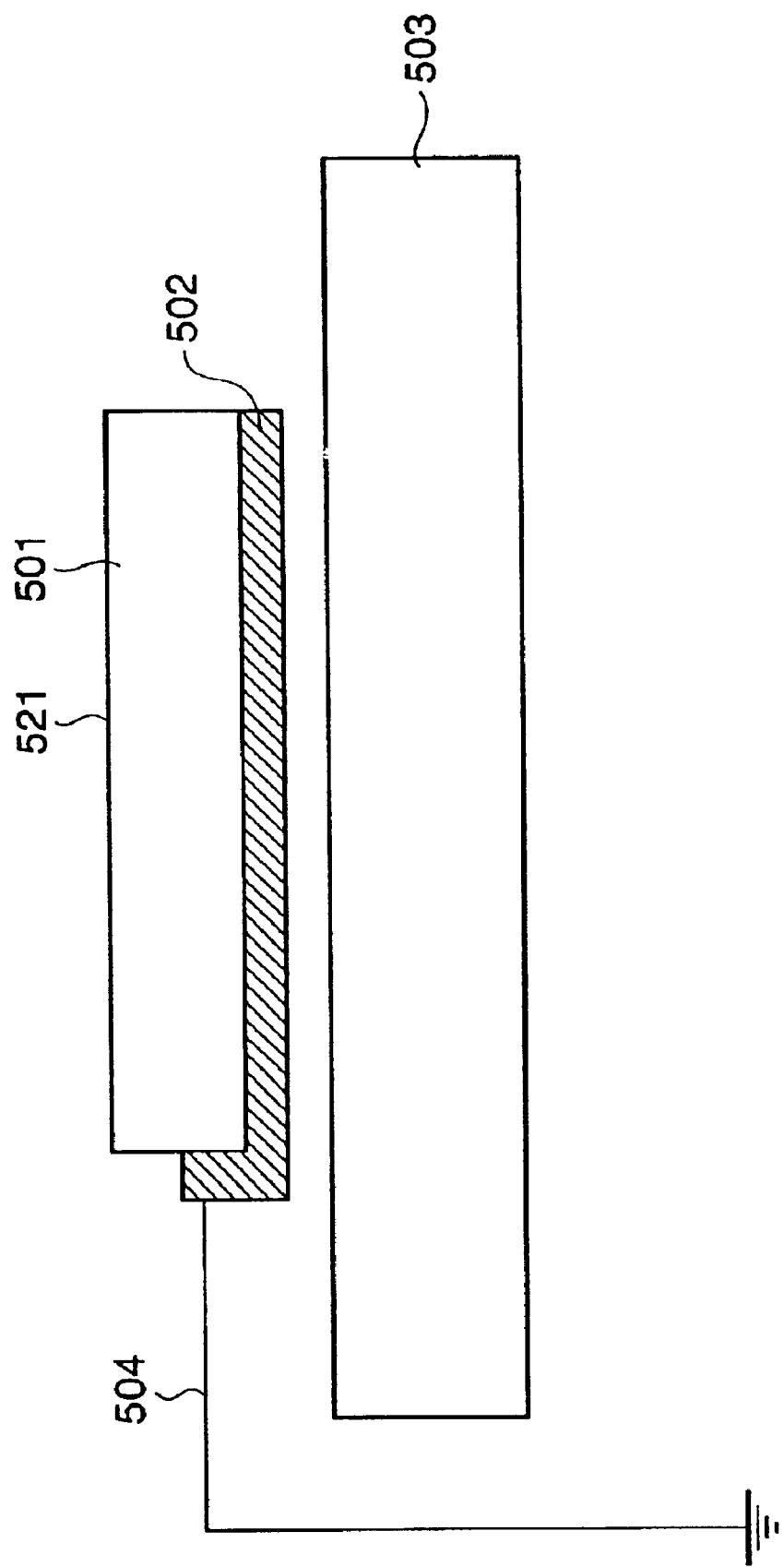
FIG. 8 is a view for explaining a wafer chuck according to the fourth embodiment of the present invention.

With the arrangement as shown in FIG. 8, a deposited surface extends to the side surface of a wafer chuck, and a lead line for grounding can be mounted with ease. For this reason, the productivity of exposure apparatuses using such substrate chucks can be improved. Easy access to a lead line facilitates the maintenance of an exposure apparatus, thus enabling the improvement in convenience in maintaining the exposure apparatus.

[Fifth Embodiment]

In the third embodiment, in the wafer chuck 501, the chromium deposited portion 502 is formed as a conductive member on the surface opposite to the holding surface on which the wafer 507 is chucked. In this embodiment, a wafer chuck 501 is comprised of two members (501a and 501b in FIG. 9), which are formed by separating the wafer chuck 501 in the direction of thickness of the wafer chuck 501. A conductive member is sandwiched between the two members, and the conductive portion is grounded.

Figure 9:
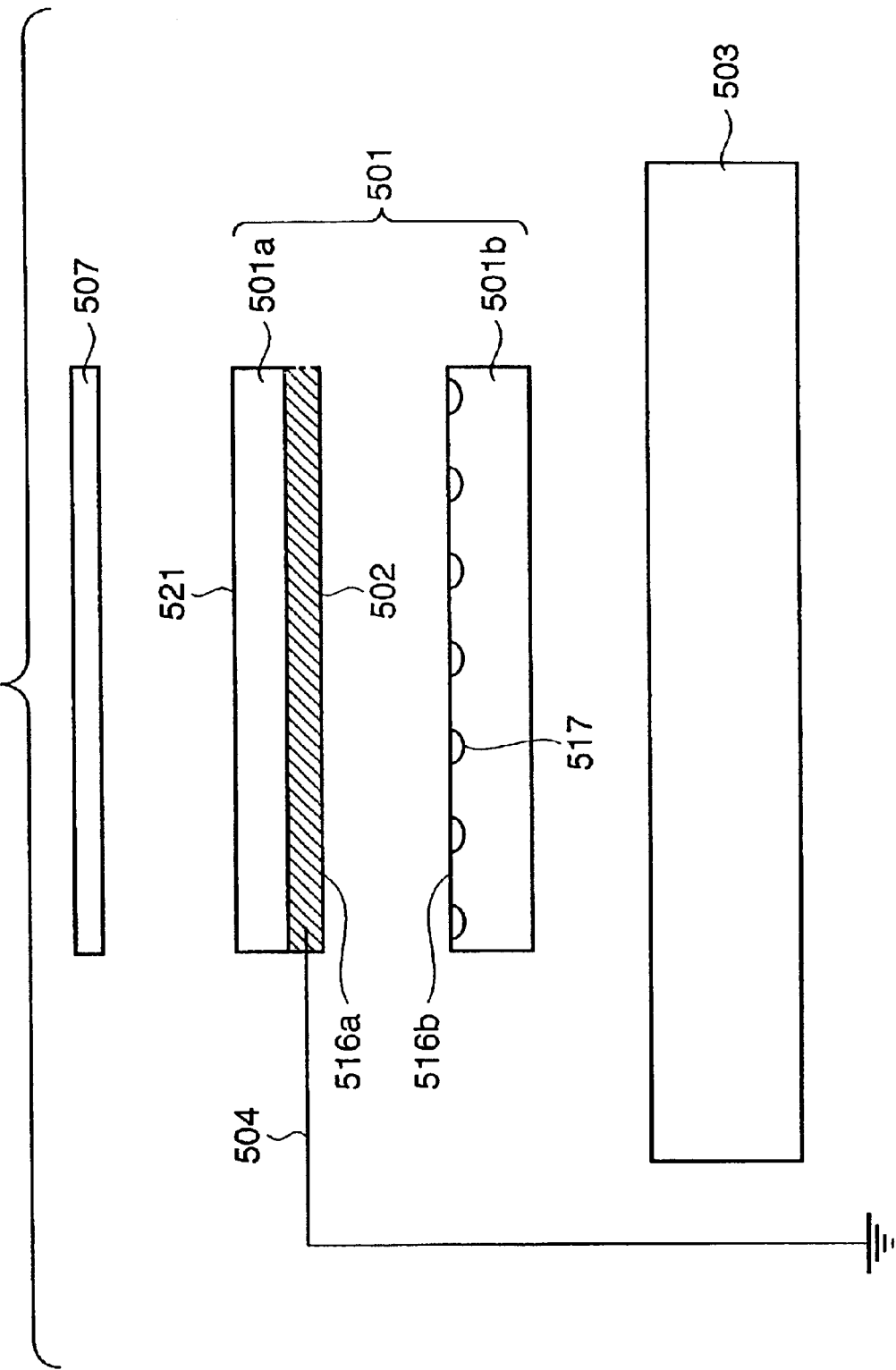
FIG. 9 is a view for explaining a wafer chuck according to the fifth embodiment of the present invention.

Assume a case wherein internal pipes are formed to cause a temperature adjusting fluid to flow for controlling the temperature of a wafer 507. The wafer chuck 501 is so arranged as to have the two separated members 501a and 501b, as shown in FIG. 9, and each member is manufactured separately. In the manufacturing step, internal pipes are formed in one member, and then the two members are bonded to each other to form the wafer chuck 501. In this case, chromium can be deposited on a surface to be bonded of the member 501a and/or that of the member 1b to ground chromium deposited portion(s) 502 (FIG. 9). Referring to FIG. 9, reference numerals 516a and 516b denote surfaces to be bonded of the two members 501a and 501b, respectively. Semicircular concave portions 517, formed in the surface 516b to be bonded of the member 51b, are flow paths serving as internal pipes for causing a temperature adjusting fluid to flow for controlling the temperature of the wafer 507. Note that FIG. 9 shows a state wherein the two members 501a and 501b are not bonded to each other yet, and the wafer 507 is not chucked.

As a grounding method, the chromium deposited portion 502 may be extended to the side surface portion of the wafer chuck 501 and grounded from the side surface of the wafer chuck 501, as described in the second embodiment. Other than this, for example, a hole may be formed in the wafer chuck portion 501b on the chuck base 503 side to lay a lead line for grounding (not shown), and the lead line may be mounted on the chuck base 503 side to cause the lead line to come into contact with the chromium deposited portion 502 through the hole in the wafer chuck portion 501b.

The chromium deposited portion 502 may be formed by depositing chromium on the surface 16b to be bonded, in which the internal pipes 517 are formed, or on the surface 516a to be bonded without the internal pipes 517.

In this embodiment, in the wafer chuck 501 comprised of the two members (501a and 501b), the chromium deposited portion 502 is formed on the surface 516a to be bonded of the wafer chuck member 501a on which the wafer is to be chucked. However, the present invention is not limited to this. The chromium deposited portion 502 may be formed on the surface 516b to be bonded of the wafer chuck portion 501b, in which the internal pipes 517 are formed. Alternatively, the chromium deposited portion 502 may be formed on both the surfaces 516a and 516b to be bonded.

A material having a volume resistivity of $10 \times 10^{-6}$ Ω cm or less, such as gold, is preferably used for deposition in place of chromium. Even a material having a volume resistivity of about 1.0 Ω cm can exhibit the same effect as described above. In this embodiment, the conductive member is formed by deposition. However, the present invention is not limited to this. Instead, the conductive member may be formed by plating, or a metal plate may be sandwiched between the wafer chuck 501 and chuck base 503 to be bonded to the surfaces 516a and 516b to be bonded of the wafer chuck 501.

In this embodiment, the internal pipes 517 are formed in the wafer chuck portion 501b on the chuck base 503 side. However, the internal pipes 517 may be formed in the wafer chuck portion 501a on the wafer 507 side, or in both the wafer chuck portions 501a and 501b.

In this embodiment, the step of forming the internal pipes 517 has been described, together with the step of forming the chromium deposited portion 502. If the chromium deposited portion 502 exists between the two wafer chuck members 501a and 501b and is grounded, some effect can always be obtained. A sufficient effect can be obtained without the internal pipes 517.

Since the exposed area of the deposited surface of the wafer chuck itself is small, generation of any particles or contamination due to a metal can be minimized, thus increasing the yield in semiconductor manufacturing.

[Sixth Embodiment]

An embodiment of calibration of an electrostatic capacitance sensor will be described next.

Figure 10:
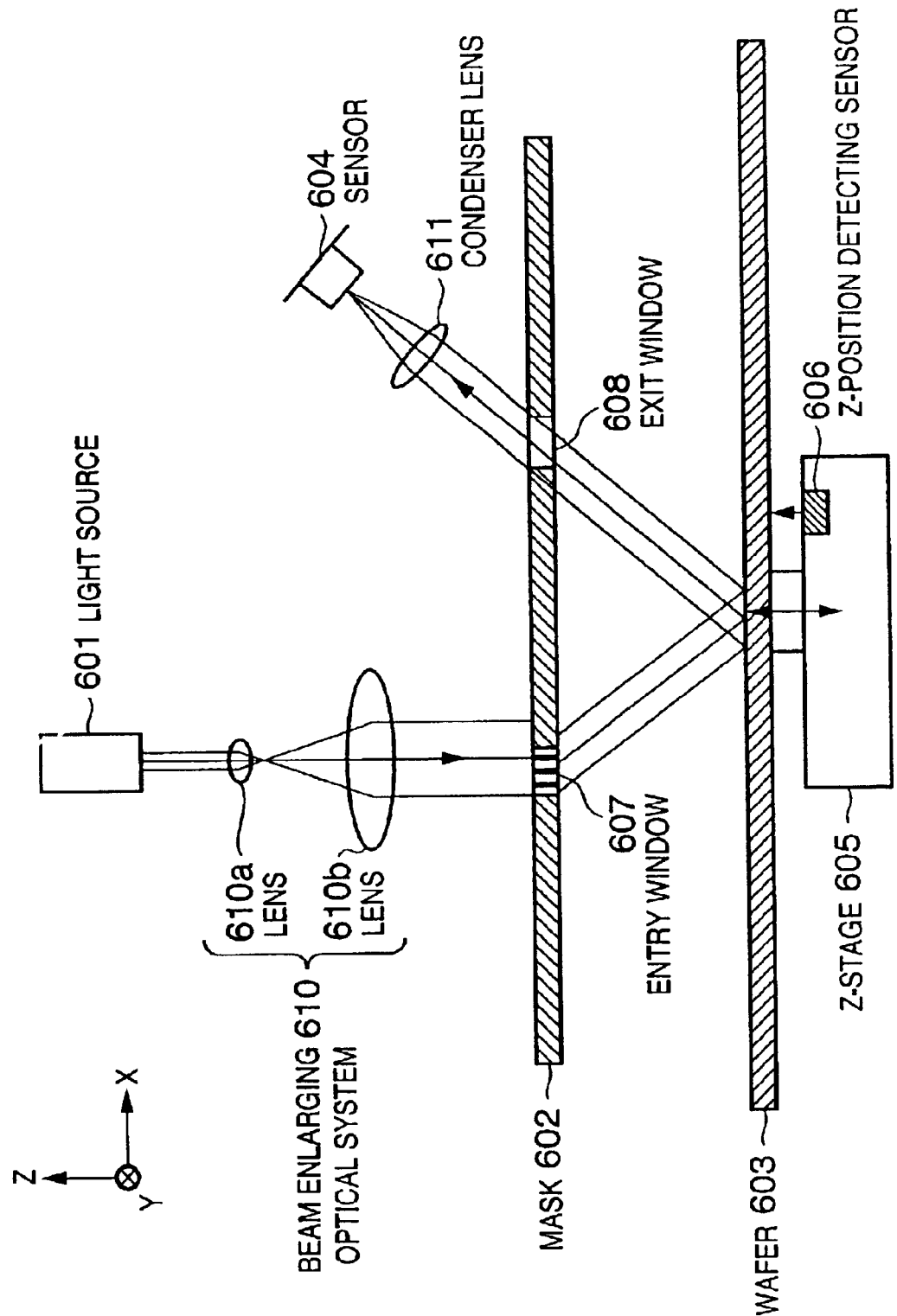
FIG. 10 is a schematic sectional view showing a state wherein the gap between the mask and the wafer is adjusted by the method of the sixth embodiment of the present invention.
Figure 11:
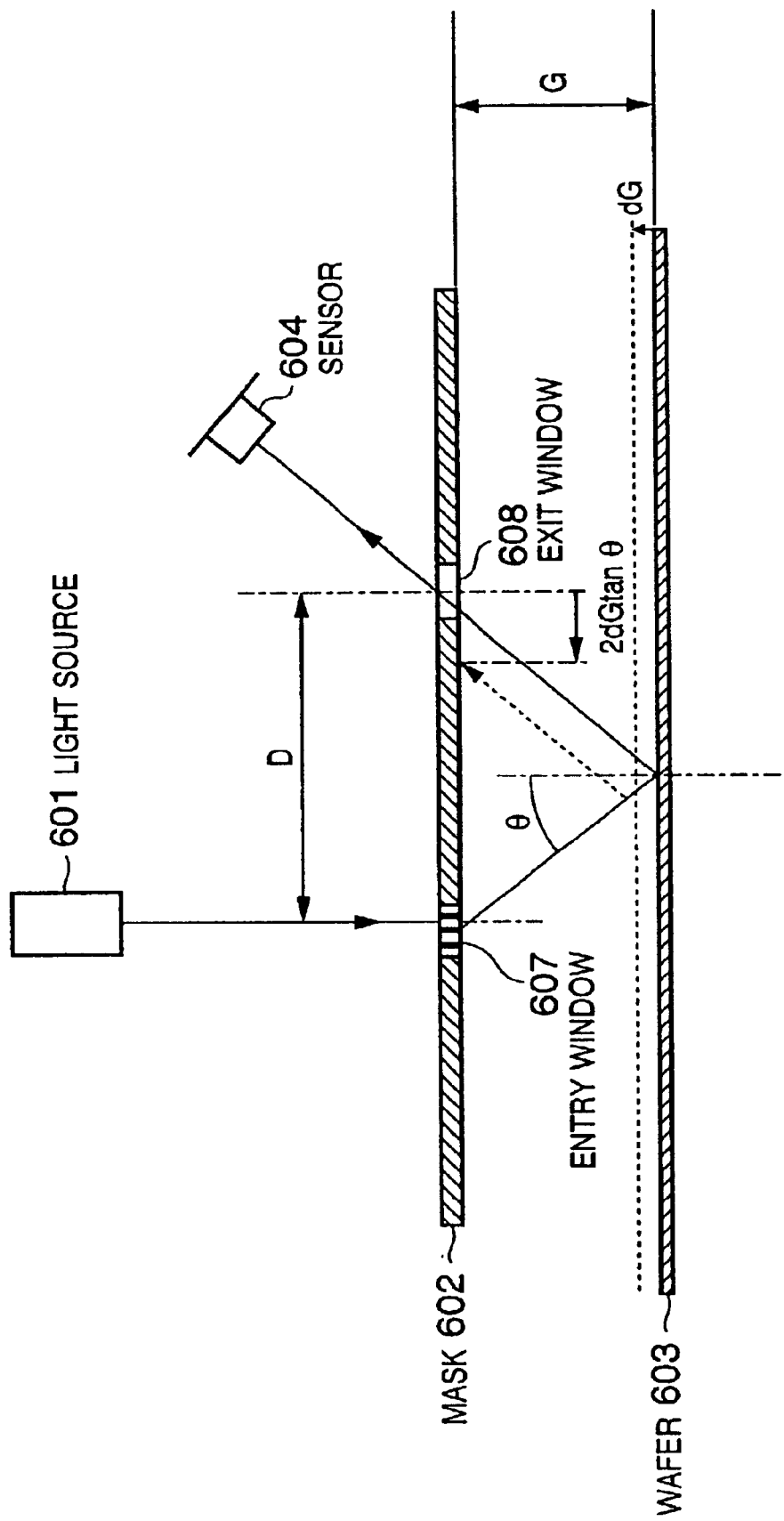
FIG. 11 is a schematic sectional view showing the dimensions of the respective portions in the method shown in FIG. 10.
Figure 12:
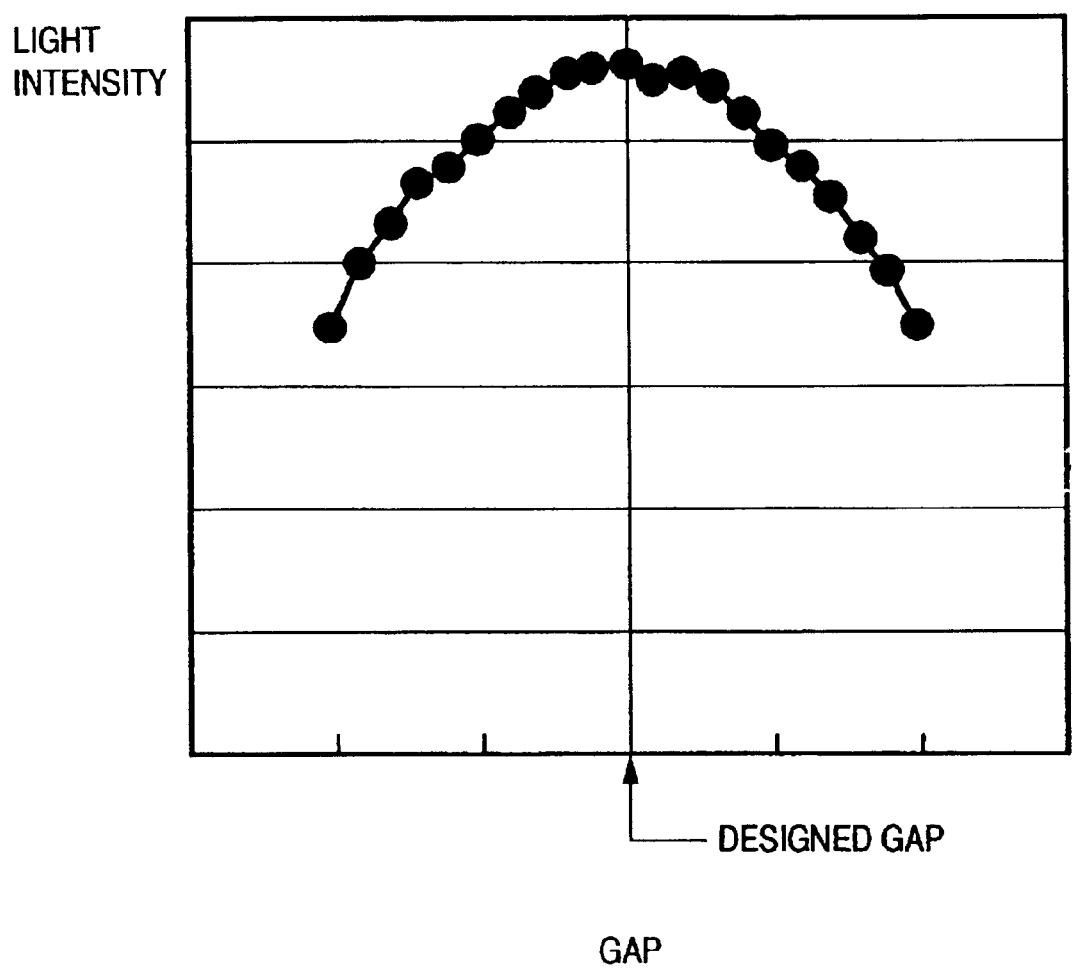
FIG. 12 is a graph showing a change in light intensity detected by a sensor while changing the gap between the mask and the wafer.
Figure 13:
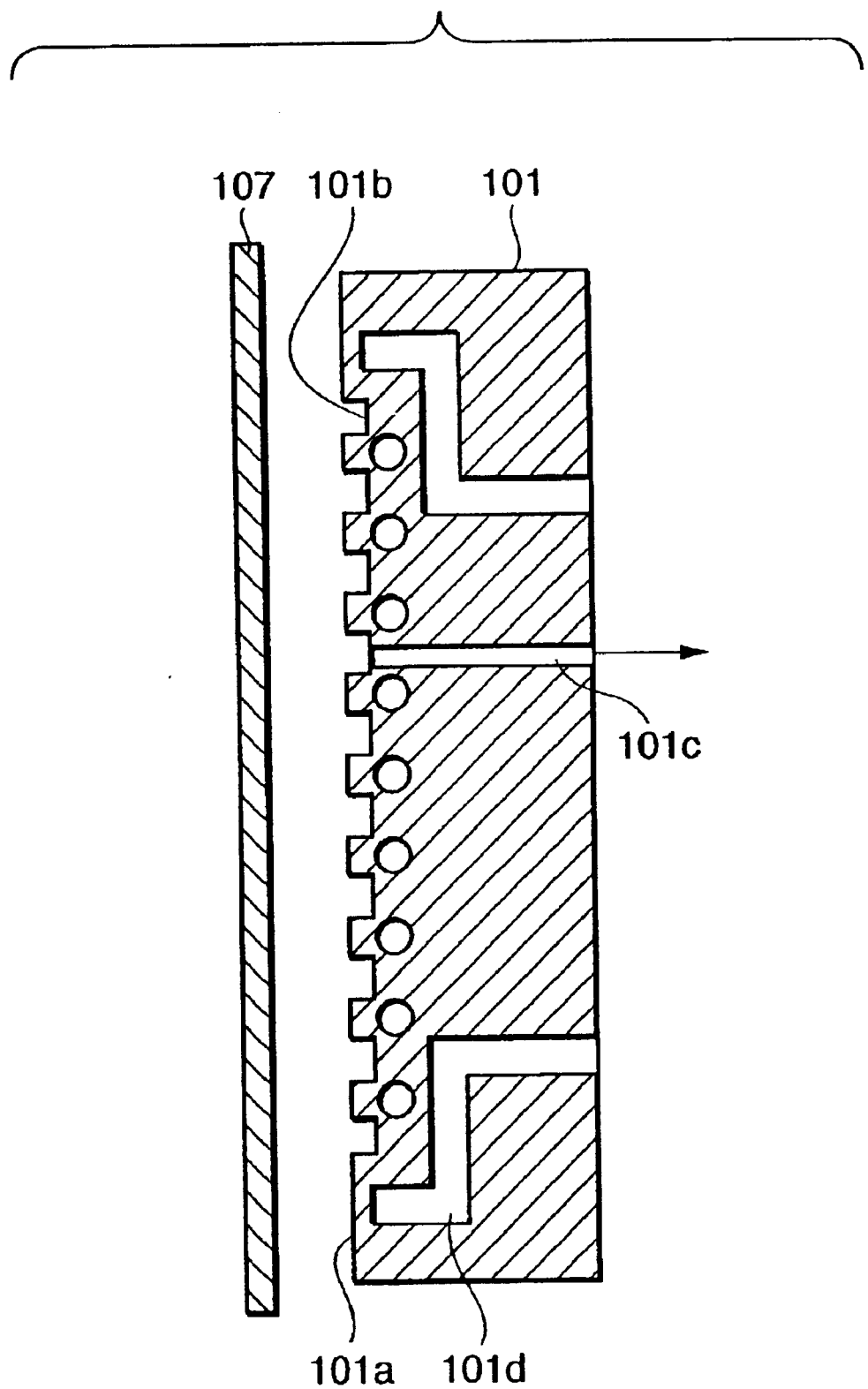
FIG. 13 is a view for explaining a conventional wafer chuck.

Before the above-described gap adjustment between the mask and the wafer using the electrostatic capacitance sensor, gap adjustment using light, which will be described below with reference to FIGS. 10 to 12, is executed to calibrate the electrostatic capacitance sensor. With this arrangement, the gap between the mask and the wafer using the electrostatic capacitance sensor can be more accurately adjusted.

This calibration needs to be done ideally once after the exposure apparatus is assembled. Generally, however, the calibration is executed periodically or when the reproducibility or stability of measurement by the electrostatic capacitance sensor degrades.

FIG. 10 is a schematic sectional view showing a state wherein the gap between a mask 602 and a wafer 603 is determined by the method of the sixth embodiment of the present invention. The wafer 603 is placed on a Z-stage 605 which holds the wafer to be movable in the Z-direction. A Z-position detecting sensor 606 for detecting the Z-direction position of the wafer 603 is arranged on the Z-stage 605. The mask 602 is fixed in parallel to the wafer 603.

A light source 601 and a beam enlarging optical system 610 which is formed from lenses 610a and 610b to shape emitted light into a desired beam diameter are arranged on the mask 602. Note that this optical system may be a beam reducing optical system. In addition, a sensor 604 for detecting light incident through a condenser lens 611 is arranged.

In this embodiment, the mask 602 undergoes a predetermined process to determine the gap. More specifically, an entry window 607 and exit window 608, which pass light, are opened in the X-direction while being separated by a predetermined distance. The entry window 607 and exit window 608 can have the same size. The light source 601 and beam enlarging optical system 610 are designed to input light to the entry window 607 of the mask 602 vertically from the upper side. The entry window 607 serves as a transparent linear diffraction grating in which light-transmitting portions are laid out at a predetermined pitch in the X-direction. Let Px be the pitch of the diffraction grating, and λ be the wavelength of the light that is input vertically from the upper side. The pitch Px and wavelength λ satisfy $$Px = \lambda/\sin\theta \quad (3)$$

such that the incident light is diffracted at a 1st-order diffraction angle θ.

In order to cause reflected light, which is generated when the 1st-order diffraction light obtained by diffracting the light incident on the entry window 607 is positively reflected by the surface of the wafer 603, to pass through the exit window 608 when the gap between the mask 602 and the wafer 603 is a predetermined gap G (designed gap), a gap D between the entry window 607 and the exit window 608 satisfies $$G = D/(2\tan\theta) \quad (4)$$

as shown in FIG. 11. The sensor 604 is located at a position where the reflected light emerging from the exit window 608 can be detected.

The gap adjusting method for the mask 602 and wafer 603 according to this embodiment is executed by changing the Z-direction position of the wafer 603 by the Z-stage 605 while light having the wavelength X is kept incident from the light source 601 onto the entry window 607 of the mask 602. At this time, a change in intensity of light that exits the exit window 608 is detected by the sensor 604. In FIG. 12, the ordinate represents the detected change in light intensity, and the abscissa represents the Z-position of the wafer 603 detected by the Z-position detecting sensor 606. The Z-position of the wafer 603 corresponds to the gap between the mask 602 and the wafer 603 and is expressed as a "gap" in FIG. 12.

The wavelength λ, pitch Px, and gap D are set as described above. Hence, when the mask 602 and wafer 603 have the gap G, reflected light obtained when 1st-order diffraction light at the entry window 607 is positively reflected by the wafer 603 reaches the sensor 604 through the exit window 608. When the gap shifts by dG, the incident position of the reflected light on the mask 602 shifts by 2dGtan θ, as shown in FIG. 11. Hence, some components of the light beam are shielded by the mask. The intensity of light that exits the exit window 608 is highest when the mask 602 and wafer 603 have the predetermined gap G and becomes low as the gap deviates from the gap G.

In the gap adjusting method of this embodiment, an arrangement in which the light intensity detected by the sensor 604 is highest is determined as an arrangement in which the mask 602 and wafer 603 have the predetermined distance G. According to this method, the gap between the mask 602 and the wafer 603 can be adjusted without making them abut against each other. Hence, the mask and wafer can be accurately arranged while being separated by a predetermined distance.

In this embodiment, the position at which the light intensity detected by the sensor 604 is maximized may be obtained by obtaining an approximate curve of a graph of a change in light intensity, as shown in FIG. 12, using a quadratic function or the like and detecting the peak position of this approximate curve. In this way, the position at which the light intensity is maximized can be more accurately determined.

When a device for executing gap adjustment using light is arranged in an exposure apparatus as a calibration section, the electrostatic capacitance sensor can be calibrated. Hence, the gap measurement accuracy by the electrostatic capacitance sensor can be increased.

[Embodiment of a Production System]

Next, an example of a semiconductor device (e.g., a semiconductor chip of an IC, LSI, or the like, a liquid crystal panel, a CCD, a thin film magnetic head, or a micromachine) production system will be described. This system performs maintenance services such as trouble shooting, periodical maintenance, or software delivery for manufacturing apparatuses installed in a semiconductor manufacturing factory, by utilizing a computer network outside the manufacturing factory.

Figure 14:
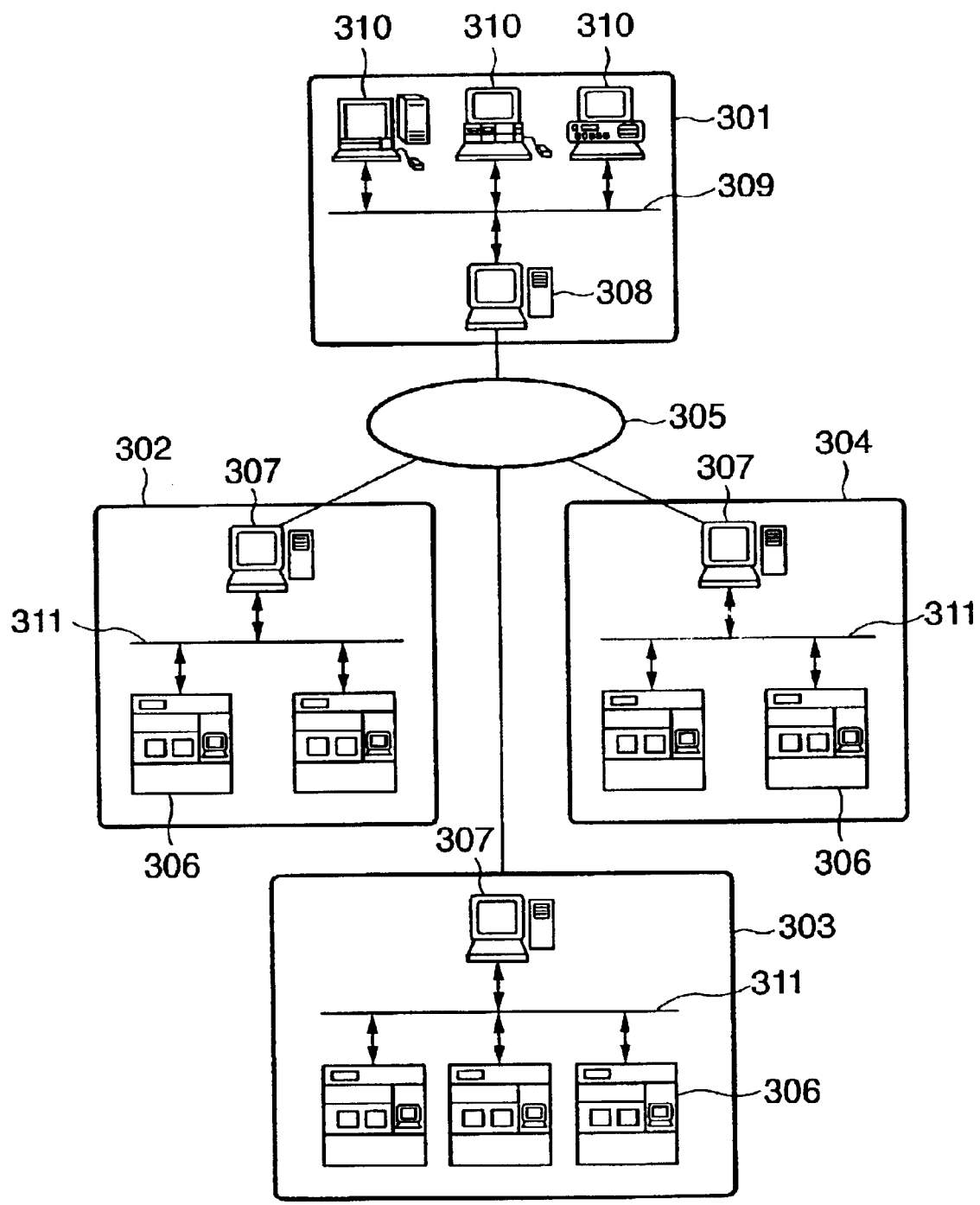
FIG. 14 is a view showing a semiconductor device production system when viewed at a given angle.

FIG. 14 shows the entire system when viewed at a given angle. Referring to FIG. 14, reference numeral 301 denotes the office of a vendor (apparatus maker) of semiconductor device manufacturing apparatuses. As actual manufacturing apparatuses, assume semiconductor manufacturing apparatuses used in a semiconductor manufacturing factory for performing various processes such as preprocess devices (e.g., lithography apparatuses including an exposure apparatus, a resist processing apparatus, and an etching apparatus, an annealing apparatus, a film forming apparatus, a planarizing apparatus, and the like) and post-process devices (e.g., an assembly apparatus, an inspection apparatus, and the like). The office 301 has a host management system 308 which provides a maintenance database for the manufacturing apparatus, a plurality of operation terminal computes 310, and a local area network (LAN) 309 which connects them to construct an intranet. The host management system 308 has a gateway which connects the LAN 309 to the Internet 305 serving as an external network of the office, and a security function of limiting access from the outside.

Reference numerals 302 to 304 denote manufacturing factories of semiconductor makers as the users of the manufacturing apparatuses. The manufacturing factories 302 to 304 may belong to different makers or a single maker (e.g., preprocess factories and post-process factories). Each of the factories 302 to 304 has a plurality of manufacturing apparatuses 306, a local area network (LAN) 311 which connects the apparatuses to construct an intranet, and a host management system 307 serving as a monitoring apparatus for monitoring operation situations of the manufacturing apparatuses 306. The host management system 307 arranged in each of the factories 302 to 304 has a gateway which connects the LAN 311 in that factory to the Internet 305 as the external network of the factory. In this arrangement, the host management system 308 on the vendor 301 side can be accessed from the LAN 311 in each factory via the Internet 305. The security function of the host management system 308 allows only limited users to access the system. More specifically, status information that indicates the operation situation of each manufacturing apparatus 306 (e.g., the problem of a manufacturing apparatus in trouble) is supplied from the factory side to the vendor side via the Internet 305. In addition, response information to the notification (e.g., information that instructs a measure against the trouble, or remedy software or data) or maintenance information such as latest software and help information can be received from the vendor side via the Internet 305. For data communication between the factories 302 to 304 and the vendor 301 and data communication in the LAN 31 of each factory, a communication protocol (TCP/IP) that is generally used in the Internet is used. Instead of using the Internet as the external network of each factory, a dedicated line network (e.g., ISDN) which has high security and does not allow access from third parties may be used. Furthermore, the host management system is not limited to that provided by the vendor. A database constructed by a user may be installed on an external network such that the user allows access from a plurality of factories to the database.

Figure 15:
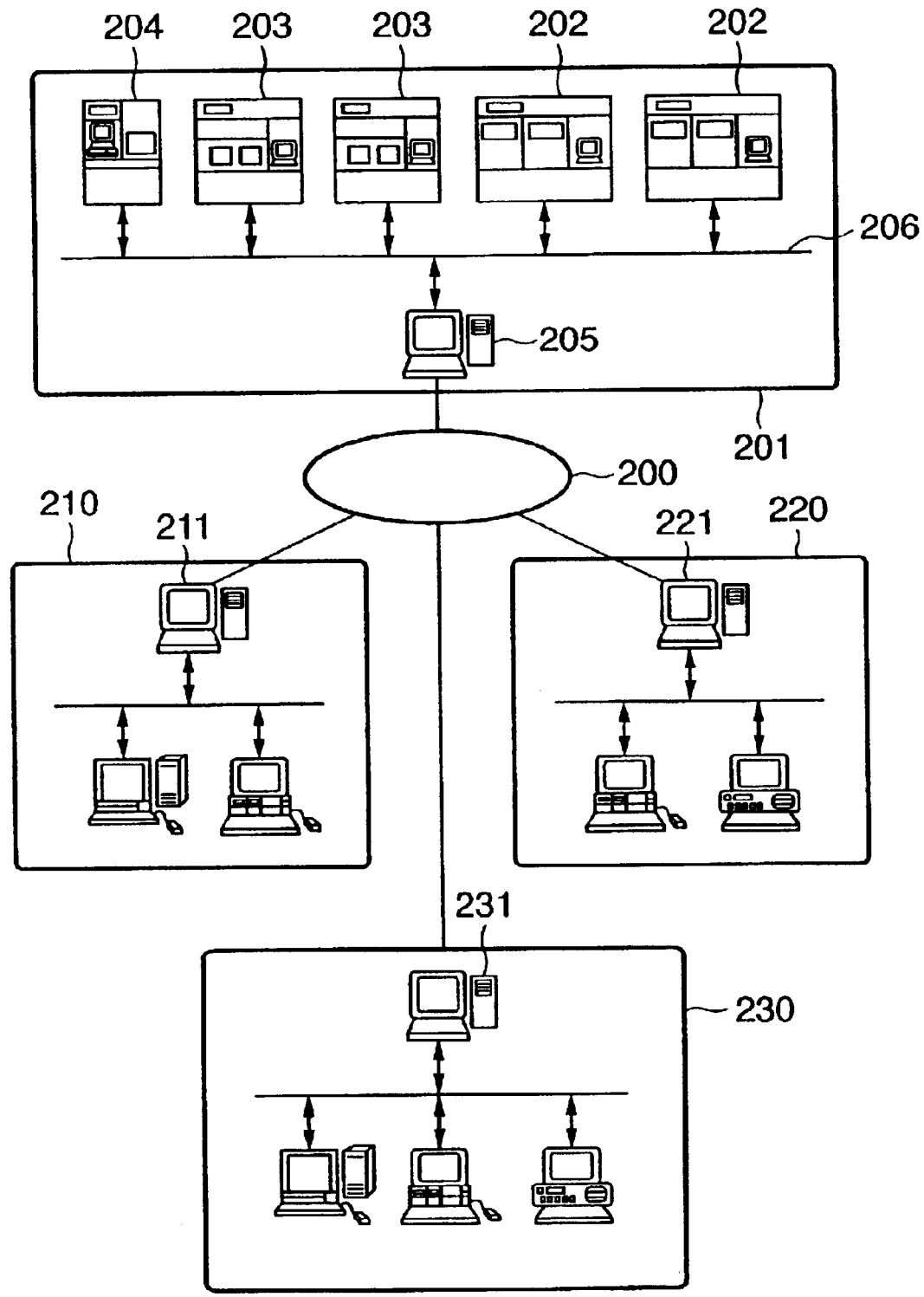
FIG. 15 is a view showing the semiconductor device production system when viewed at another angle.

FIG. 15 is a view showing the entire system of this embodiment when viewed at another angle different from FIG. 14. In the above example, a plurality of user factories each having manufacturing apparatuses and the management system of the vendor of the manufacturing apparatuses are connected via an external network. Data communication is performed for production management for each factory and transmission of information of at least one manufacturing apparatus. To the contrary, in this example, a factory having manufacturing apparatuses of a plurality of vendors is connected to the management systems of the respective vendors of the plurality of manufacturing apparatuses via an external network outside the factory, and data communication is performed to transmit maintenance information of each manufacturing apparatus. Referring to FIG. 15, reference numeral 201 denotes a manufacturing factory of a manufacturing apparatus user (semiconductor device maker). Manufacturing apparatuses for performing various processes, for example, an exposure apparatus 202, a resist processing apparatus 203, and a film forming apparatus 204 are introduced into the manufacturing line. FIG. 15 shows only one manufacturing factory 201. In fact, however, a plurality of factories are connected through a network. Apparatuses in each factory are connected through a network. Apparatuses in each factory are connected by a LAN 206 to construct an intranet. A host management system 205 manages the operation of the manufacturing line. On the other hand, the offices of vendors (apparatus makers) such as an exposure apparatus maker 210, a resist processing apparatus maker 220, and a film forming apparatus maker 230 respectively have host management systems 211, 221, and 231 for remote maintenance of the provided devices. As described above, each host management system has a maintenance database and a gateway to an external network. The host management system 205 for managing the apparatuses in the user manufacturing factory is connected to the management systems 211, 221, and 231 of the vendors via the Internet or dedicated line network serving as an external network 200. In this system, if one of the manufacturing devices of the manufacturing line has a trouble, the operation of the manufacturing line stops. However, the trouble can be quickly solved by receiving remote maintenance from the vendor of the device in trouble through the Internet 200. Thus, the suspension of the manufacturing line can be minimized.

Each manufacturing apparatus installed in the semiconductor manufacturing factory has a display, a network interface, and a computer which executes network access software stored in a storage device and apparatus operation software. As a storage device, an internal memory, a hard disk, or a network file server can be used. The network access software, including a dedicated or general-purpose web browser, provides a user interface with a window shown in FIG. 16 on the display. An operator who manages the manufacturing apparatuses in each factory inputs pieces of information such as a model (401) of a manufacturing apparatus, a serial number (402), a trouble case name (403), a date of occurrence of trouble (404), an emergency level (405), a problem (406), a remedy (407), and a progress (408) to input fields in the window while looking up the window. The pieces of input information are transmitted to the maintenance database through the Internet. Appropriate maintenance information as a result is returned from the maintenance database and presented on the display. In addition, the user interface provided by the web browser also realizes hyper link functions (410 to 412), as shown in FIG. 16. The operator can access more detailed information of each item, download software of the latest version to be used in a manufacturing apparatus from a software library provided by the vendor, or download operation guidance (help information) for the operator's reference.

Figure 17:
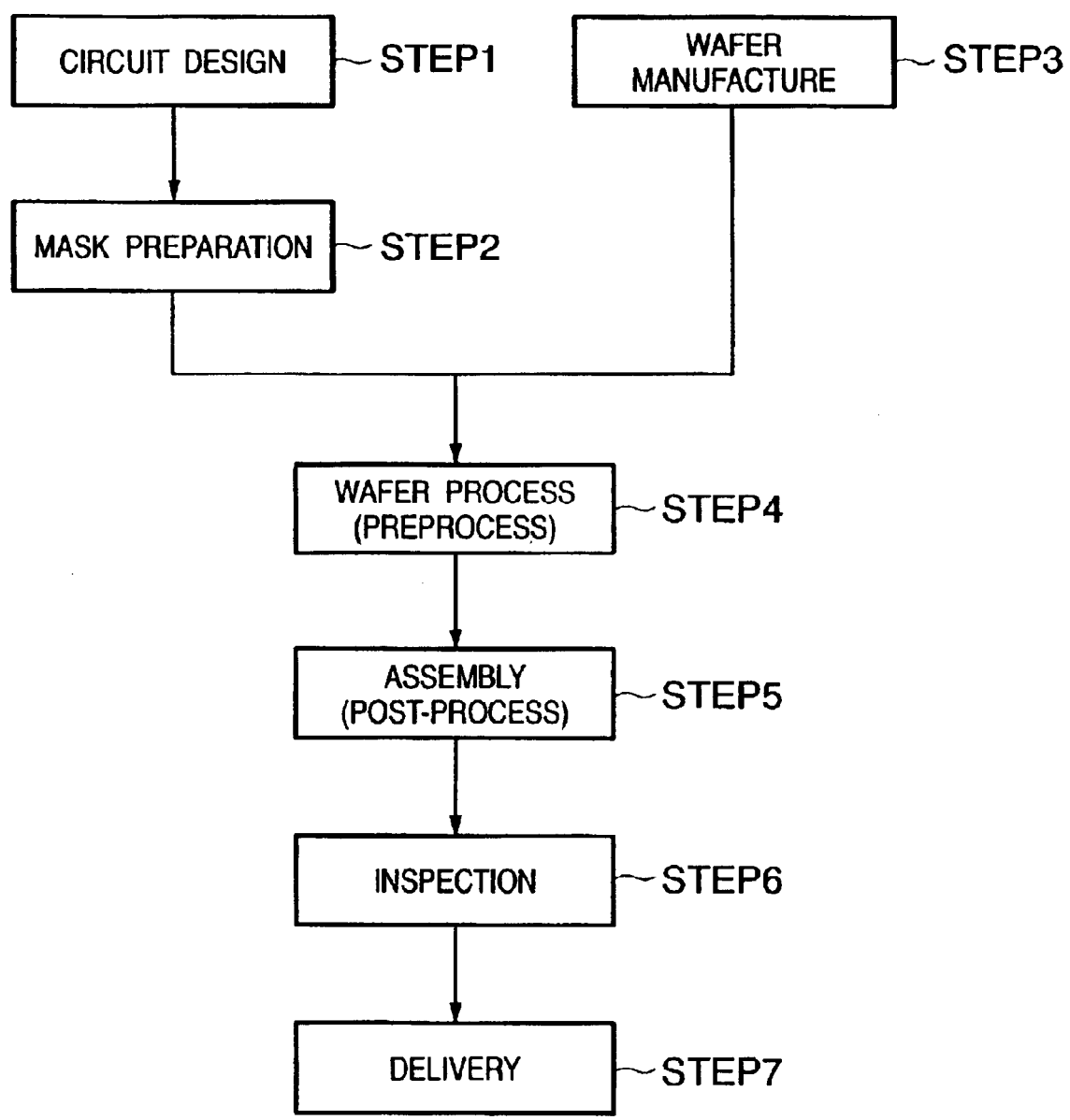
FIG. 17 is a flow chart for explaining the flow of a device manufacturing process.

A semiconductor device manufacturing process using the above-described production system will be described next. FIG. 17 shows the flow of the entire manufacturing process of a semiconductor device. In step 1 (circuit design), the circuit of a semiconductor device is designed. In step 2 (mask preparation), a mask having the designed circuit pattern is prepared. In step 3 (wafer manufacture), a wafer is manufactured using a material such as silicon. In step 4 (wafer process), called a pre-process, an actual circuit is formed on the wafer by lithography using the prepared mask and wafer. In step 5 (assembly), called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7). The pre-process and post-process are separately executed in dedicated factories. Maintenance is performed for each factory by the above-described remote maintenance system. Information for production management or apparatus maintenance is exchanged even between the pre-process factory and the post-process factory by data communication through the Internet or dedicated line network.

Figure 18:
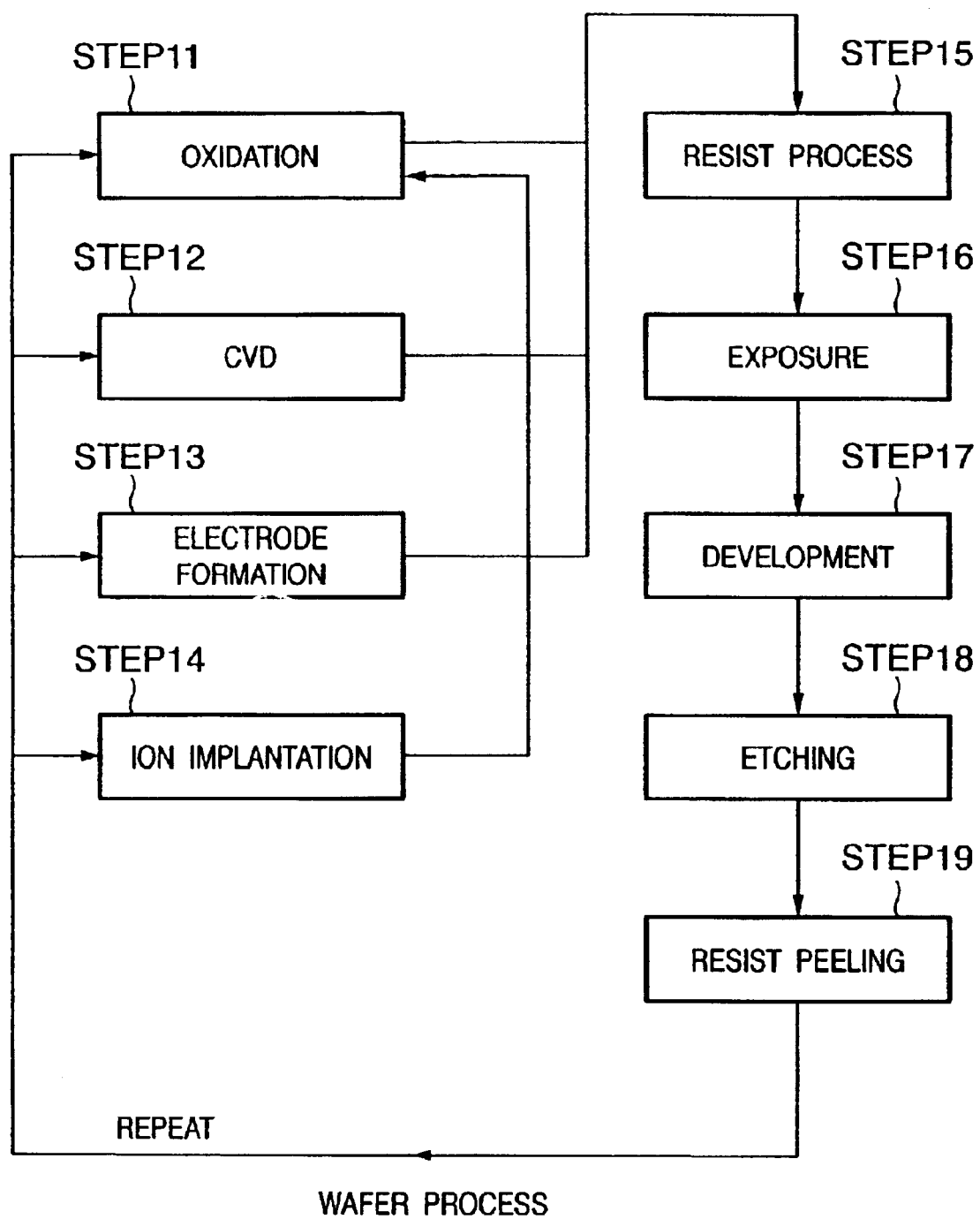
FIG. 18 is a flow chart for explaining a wafer process.

FIG. 18 shows the detailed flow of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photoresistive material is coated to the wafer. In step 16 (exposure), the circuit pattern of the mask is printed on the wafer by exposure using the above-described exposure apparatus. In step 17 (development), the exposed wafer is developed. In step 18 (etching), portions other than the developed resist image are etched. In step 19 (resist peeling), any unnecessary resist remaining after etching is removed. By repeating these steps, a multilayered structure of circuit patterns is formed on the wafer. In the manufacturing apparatus used in the steps, since an optical encoder described above is used when a wafer or resist must be accurately positioned, the yield in manufacturing semiconductor devices can be improved. In addition, since each manufacturing apparatus is maintained by the above-described remote maintenance system, any trouble can be prevented. Even when a trouble occurs, the production can be quickly resumed. For this reason, the productivity of semiconductor devices can be improved.

As has been described above, according to the present invention, a conductive member is formed on a surface of a wafer chuck, where a wafer is to be chucked. In addition, the conductive member is electrically grounded. With this arrangement, when the height information of a wafer is measured by an electrostatic capacitance sensor, the measurement accuracy can be increased.

The gap setting accuracy or AF accuracy based on the measurement result increases. Hence, an exposure apparatus with a higher exposure transfer accuracy can be provided.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to a pattern of a mask, said apparatus comprising:
    a chuck member which comprises a nonconductive holding section to hold the substrate; and
    an electrostatic capacitance sensor which measures a height of the substrate held by said chuck member,
    wherein said chuck member comprises a conductive member which is electrically grounded.

2. An apparatus according to claim 1, further comprising a calibration section which executes calibration of said electrostatic capacitance sensor.

3. An apparatus according to claim 2, wherein said calibration section comprises;
    a light source section which makes light incident on an entry window formed in the mask; and
    a sensor which detects light that becomes incident from the entry window, is reflected by the substrate, and exits an exit window formed in the mask.

4. An apparatus according to claim 1, further comprising:
    an interface connected to a network;
    a computer which executes network software to data-communicate maintenance information of the exposure apparatus through the network; and
    a display which displays the maintenance information of the exposure apparatus communicated by the network software executed by said computer.

5. An apparatus according to claim 1, wherein the network software provides, on said display, a user interface connected to an external network outside a factory in which the exposure apparatus is installed to access a maintenance database provided by a vendor or user of the exposure apparatus and allows obtaining information from the database through the external network.

6. An apparatus according to claim 1, wherein said chuck member comprises said conductive member on a surface opposite to a surface which holds the substrate.

7. An apparatus according to claim 1, wherein said holding section comprises a plurality of pins.

8. An apparatus according to claim 7, wherein
    said chuck member comprises said conductive member on a surface on which said pins are provided, and said conductive member has a thickness smaller than a height of said pins.

9. An apparatus according to claim 1, wherein said chuck member comprises a plurality of portions, at least one of said plurality of portions having said conductive member.

10. An apparatus according to claim 9, wherein said plurality of portions are arranged along a direction of a thickness of said chuck member.

11. An apparatus according to claim 1, wherein said chuck member comprises a channel for a temperature-adjusted fluid.

12. An apparatus according to claim 1, wherein said chuck member comprises said conductive member on a side surface.

13. An apparatus according to claim 1, wherein said conductive member is formed by deposition.

14. An apparatus according to claim 1, wherein said conductive member is formed by plating.

15. An apparatus according to claim 1, wherein said conductive member is one of a plate and a foil.

16. An apparatus according to claim 1, wherein said chuck member comprises said conductive member inside of said chuck member.

17. A device manufacturing method comprising steps of:
    installing, in a factory, a plurality of semiconductor manufacturing apparatuses for performing various processes, including an exposure apparatus; and
    manufacturing a semiconductor device using the plurality of semiconductor manufacturing apparatuses,
    wherein the exposure apparatus comprises:
        (i) a chuck member which comprises a nonconductive holding section to hold a substrate; and
        (ii) an electrostatic capacitance sensor which measures a height of the substrate held by the chuck member, and
    wherein the chuck member comprises a conductive member which is electrically grounded.

18. A method according to claim 17, further comprising steps of:
    connecting the plurality of semiconductor manufacturing apparatuses through a local area network;
    connecting the local area network to an external network outside the factory;
    acquiring information related to the exposure apparatus from a database on the external network using the local area network and external network; and
    controlling the exposure apparatus based on the acquired information.

19. A method according to claim 18, further comprising performing one of (i) obtaining maintenance information of the exposure apparatus by data communication by accessing, through the external network, a database provided by a vendor or user of the exposure apparatus, and (ii) production management by data communication with a semiconductor manufacturing factory different from the semiconductor manufacturing factory through the external network.

20. A semiconductor manufacturing factory comprising:
    a plurality of semiconductor manufacturing apparatuses including an exposure apparatus;
    a local area network which connects the plurality of semiconductor manufacturing apparatuses; and
    a gateway which connects the local area network to an external network outside the semiconductor manufacturing factory,
    wherein information related to at least one of the plurality of semiconductor manufacturing apparatuses can be data-communicated, and
    the exposure apparatus comprises:
        (i) a chuck member which comprises a nonconductive holding section to hold a substrate; and
        (ii) an electrostatic capacitance sensor which measures a height of the substrate held by said chuck member, and
    wherein said chuck member comprises a conductive member which is electrically grounded.

21. A maintenance method for an exposure apparatus, said method comprising steps of:
    causing a vendor or user of the exposure apparatus to provide a maintenance database connected to an external network outside a semiconductor manufacturing factory;

connecting the exposure apparatus to a local area network in the factory; and maintaining the exposure apparatus based on information accumulated in the database using the external network and local area network, wherein the exposure apparatus comprises:

a chuck member which comprises a nonconductive holding section to hold a substrate; and an electrostatic capacitance sensor which measures a height of the substrate held by the chuck member, and wherein the chuck member comprises a conductive member which is electrically grounded.

* * * * *